(12) United States Patent
Sakakibara et al.

(10) Patent No.: US 12,336,367 B2
(45) Date of Patent: Jun. 17, 2025

(54) DISPLAY DEVICE

(71) Applicant: SHARP KABUSHIKI KAISHA, Sakai (JP)

(72) Inventors: Yusuke Sakakibara, Sakai (JP); Masumi Kubo, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 18/039,239

(22) PCT Filed: Nov. 30, 2020

(86) PCT No.: PCT/JP2020/044437
§ 371 (c)(1),
(2) Date: May 27, 2023

(87) PCT Pub. No.: WO2022/113324
PCT Pub. Date: Jun. 2, 2022

(65) Prior Publication Data
US 2023/0422553 A1 Dec. 28, 2023

(51) Int. Cl.
| | |
|---|---|
| *H10K 50/115* | (2023.01) |
| *G09G 3/00* | (2006.01) |
| *G09G 3/32* | (2016.01) |
| *H01L 21/66* | (2006.01) |
| *H10K 59/121* | (2023.01) |
| *H10K 59/131* | (2023.01) |

(52) U.S. Cl.
CPC ........... *H10K 50/115* (2023.02); *G09G 3/006* (2013.01); *G09G 3/32* (2013.01); *H01L 22/30* (2013.01); *H10K 59/1213* (2023.02); *G09G 2300/0842* (2013.01); *G09G 2330/12* (2013.01); *H10K 59/131* (2023.02)

(58) Field of Classification Search
CPC ....... H10K 59/1213; G09G 3/006; G09G 3/32
USPC ........................................................ 345/211
See application file for complete search history.

(56) References Cited

U.S. PATENT DOCUMENTS

| | | | |
|---|---|---|---|
| 2016/0240794 A1* | 8/2016 | Yamada | H10K 85/6572 |
| 2017/0358503 A1* | 12/2017 | Liu | B65G 43/08 |
| 2020/0169623 A1* | 5/2020 | Shin | H10K 59/131 |
| 2021/0066644 A1* | 3/2021 | Lee | H10K 50/844 |
| 2021/0210564 A1* | 7/2021 | Chae | H10K 59/353 |
| 2021/0233979 A1* | 7/2021 | Ma | H10K 59/131 |
| 2021/0294165 A1* | 9/2021 | Zhang | G02F 1/133514 |
| 2021/0313498 A1* | 10/2021 | Kim | H10D 30/6723 |
| 2022/0069047 A1* | 3/2022 | Yang | H10K 59/1213 |
| 2022/0223667 A1* | 7/2022 | Choi | H10K 50/844 |
| 2022/0302244 A1* | 9/2022 | Yuan | H10K 50/824 |
| 2022/0352292 A1* | 11/2022 | Yang | H10K 59/353 |

FOREIGN PATENT DOCUMENTS

JP         2009288735 A       12/2009

* cited by examiner

*Primary Examiner* — Calvin C Ma
(74) *Attorney, Agent, or Firm* — ScienBiziP, P.C.

(57) ABSTRACT

A display device includes a plurality of light-emitting elements each including: a first electrode; a second electrode; and a light-emitting layer between the first electrode and the second electrode, the plurality of light-emitting elements including: at least one main light-emitting element containing quantum dots in the light-emitting layer; and at least one set of compact light-emitting elements including a plurality of compact light-emitting elements smaller than the at least one main light-emitting element.

19 Claims, 23 Drawing Sheets

DISPLAY DEVICE

TECHNICAL FIELD

The present disclosure relates to display devices.

BACKGROUND ART

Japanese Unexamined Patent Application Publication, Tokukai, No. 2009-288735 discloses an image display device including red light-emitting organic EL (Electro Luminescence) elements, green light-emitting organic EL elements, and blue light-emitting organic EL elements. In the image display device of Japanese Unexamined Patent Application Publication, Tokukai, No. 2009-288735, each organic EL element is disposed in a subpixel and divided into two regions in the subpixel. If one of the two regions of the organic EL element in the subpixel develops a defect, the region where the defect has developed is irradiated with a laser beam in a manufacturing step of the image display device, so that the region does not emit light. Hence, in the subpixel, that region of the organic EL element where no defects have developed is allowed to emit light. Defects of subpixels are repaired in this manner in the image display device of Japanese Unexamined Patent Application Publication, Tokukai, No. 2009-288735.

SUMMARY

Technical Problem

Identifying, out of the regions of the organic EL element in the subpixel in the image display device of Japanese Unexamined Patent Application Publication, Tokukai, No. 2009-288735, a region where a defect has developed requires a laborious step of, for example, a worker having to visually check the luminance of each region during the manufacture. The present disclosure, in an aspect thereof, provides a display device that allows easy inspection of the film condition of a light-emitting layer for non-uniformities.

Solution to Problem

The present disclosure, in one aspect thereof, is directed to a display device including a plurality of light-emitting elements each including: a first electrode; a second electrode; and a light-emitting layer between the first electrode and the second electrode, the plurality of light-emitting elements including: at least one main light-emitting element containing quantum dots in the light-emitting layer; and at least one set of compact light-emitting elements including a plurality of compact light-emitting elements smaller than the at least one main light-emitting element.

DESCRIPTION OF EMBODIMENTS

Embodiments

Figure 1:
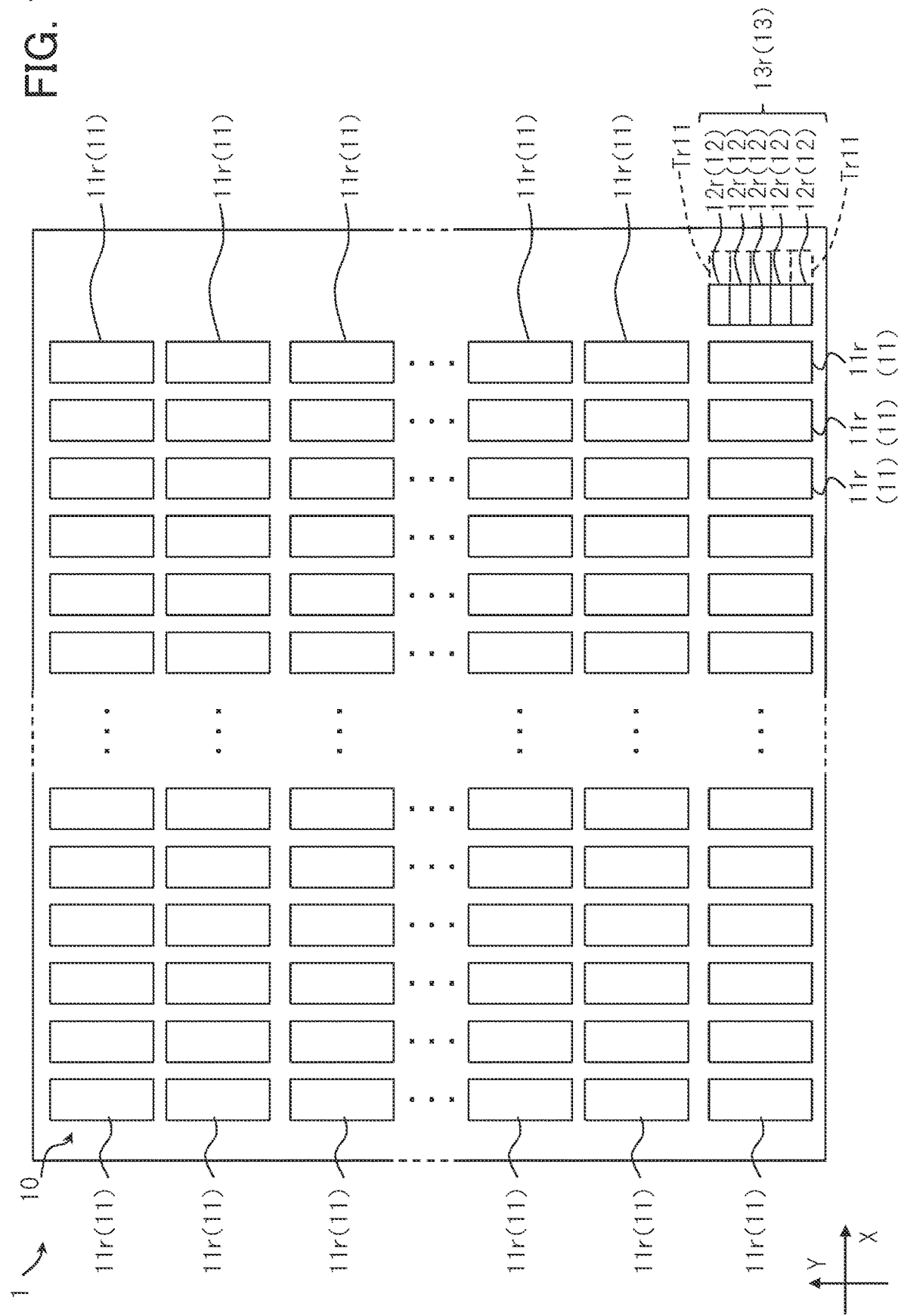
FIG. 1 is a schematic plan view of a structure of a display device in accordance with an embodiment.

FIG. 1 is a schematic plan view of a structure of a display device 1 in accordance with an embodiment. The display device 1 includes, for example, a plurality of light-emitting elements. The plurality of light-emitting elements in the display device 1 include: at least one main light-emitting element 11; and at least one set of compact light-emitting elements 13 including a plurality of compact light-emitting elements 12.

The at least one main light-emitting element 11 in the display device 1 may be one main light-emitting element 11. In the present embodiment, however, the display device 1 is described as including a plurality of main light-emitting elements 11 as an example. In addition, the at least one set of compact light-emitting elements 13 in the display device 1 may be two or more sets of compact light-emitting elements 13. In the present embodiment, however, the display device 1 is described as including a set of compact light-emitting elements 13 (a single set of compact light-emitting elements 13) as an example.

The plurality of main light-emitting elements 11 are, for example, primarily for displaying images among the plurality of light-emitting elements included in the display device 1. The plurality of main light-emitting elements 11 are arranged, for example, in a matrix in a display area 10 that is an area where images are displayed. The plurality of main light-emitting elements 11 emit, for example, monochromatic light. The plurality of main light-emitting elements 11 may emit light of any color. The plurality of main light-emitting elements 11, as an example, are a plurality of red light (first color)-emitting, main light-emitting elements 11r. Note that the plurality of main light-emitting elements 11 do not necessarily emit red light. The plurality of main light-emitting elements 11 may emit light of any color other than red, including green light (second color) which has a shorter peak wavelength than red light, blue light (third color) which has a shorter peak wavelength than green light, and white light is a mixture of red, green, and blue light.

Here, for example, "red light" refers to light with a peak wavelength of from 600 nm exclusive to 780 nm inclusive. In addition, for example, "green light" refers to light with a peak wavelength of from 500 nm exclusive to 600 nm inclusive. In addition, for example, "blue light" refers to light with a peak wavelength of from 400 nm to 500 nm both inclusive.

Note that of the directions in which the plurality of main light-emitting elements 11 are arranged in a matrix, the row direction (in FIG. 1, the left and right direction in the plane of the paper) may be referred to as the X-direction, and the column direction, which is perpendicular to the row direction, (in FIG. 1, the up/down direction in the plane of the paper) may be referred to as the Y-direction.

The one set of compact light-emitting elements 13 is, for example, used to inspect non-uniformities in the film condition of a light-emitting layer contained in a plurality of light-emitting elements among the plurality of light-emitting elements included in the display device 1. For instance, the one set of compact light-emitting elements 13 is disposed in a frame area that is an area surrounding the display area 10.

The one set of compact light-emitting elements 13 includes the plurality of compact light-emitting elements 12 which are a plurality of regions. For instance, the one set of compact light-emitting elements 13 includes five compact light-emitting elements 12. Note that the one set of compact light-emitting elements 13 does not necessarily include five compact light-emitting elements 12 and need only to include a plurality of compact light-emitting elements 12.

The one set of compact light-emitting elements 13 and the main light-emitting element 11, for example, have equal lengths in both the X-direction and the Y-direction and equal areas. The one set of compact light-emitting elements 13 and the main light-emitting element 11 have, for example, the same shape in a plan view. Each of the plurality of compact light-emitting elements 12 contained in the one set of compact light-emitting elements 13 has smaller area than the main light-emitting element 11.

For instance, the length of a longer side of each of the plurality of compact light-emitting elements 12 contained in the one set of compact light-emitting elements 13 (length in the X-direction) is shorter than the lengths of longer sides of the one set of compact light-emitting elements 13 and the main light-emitting element 11 (length in the Y-direction). In addition, for example, the length of a shorter side of each of the plurality of compact light-emitting elements 12 contained in the one set of compact light-emitting elements 13 (length in the Y-direction) is shorter than the lengths of shorter sides of the one set of compact light-emitting elements 13 and the main light-emitting element 11 (length in the X-direction).

The shorter side of the compact light-emitting elements 12 preferably has a length of, for example, from 1 μm to 20 μm both inclusive. This particular configuration enables precise sensing of non-uniformities in the film condition of the light-emitting layer in the light-emitting element provided that the compact light-emitting elements 12 can be manufactured.

For instance, the number of the plurality of compact light-emitting elements 12 contained in the one set of compact light-emitting elements 13 is approximately from 2 to 5 both inclusive. In other words, the count by which a first electrode 28 is divided into a plurality of first electrodes 27 in the one set of compact light-emitting elements 13 is approximately from 2 to 5 both inclusive.

Figure 20:
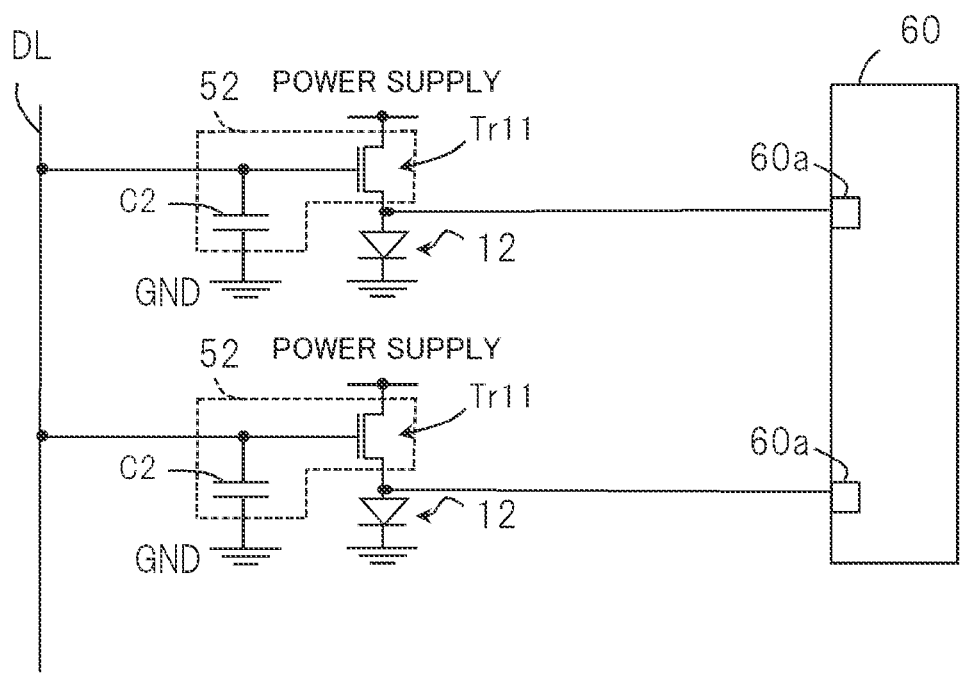
FIG. 20 is a diagram representing an exemplary circuit configuration of the plurality of first pixel circuits in the one set of first pixel circuits in accordance with Variation Example 1 of the embodiment.
Figure 21:
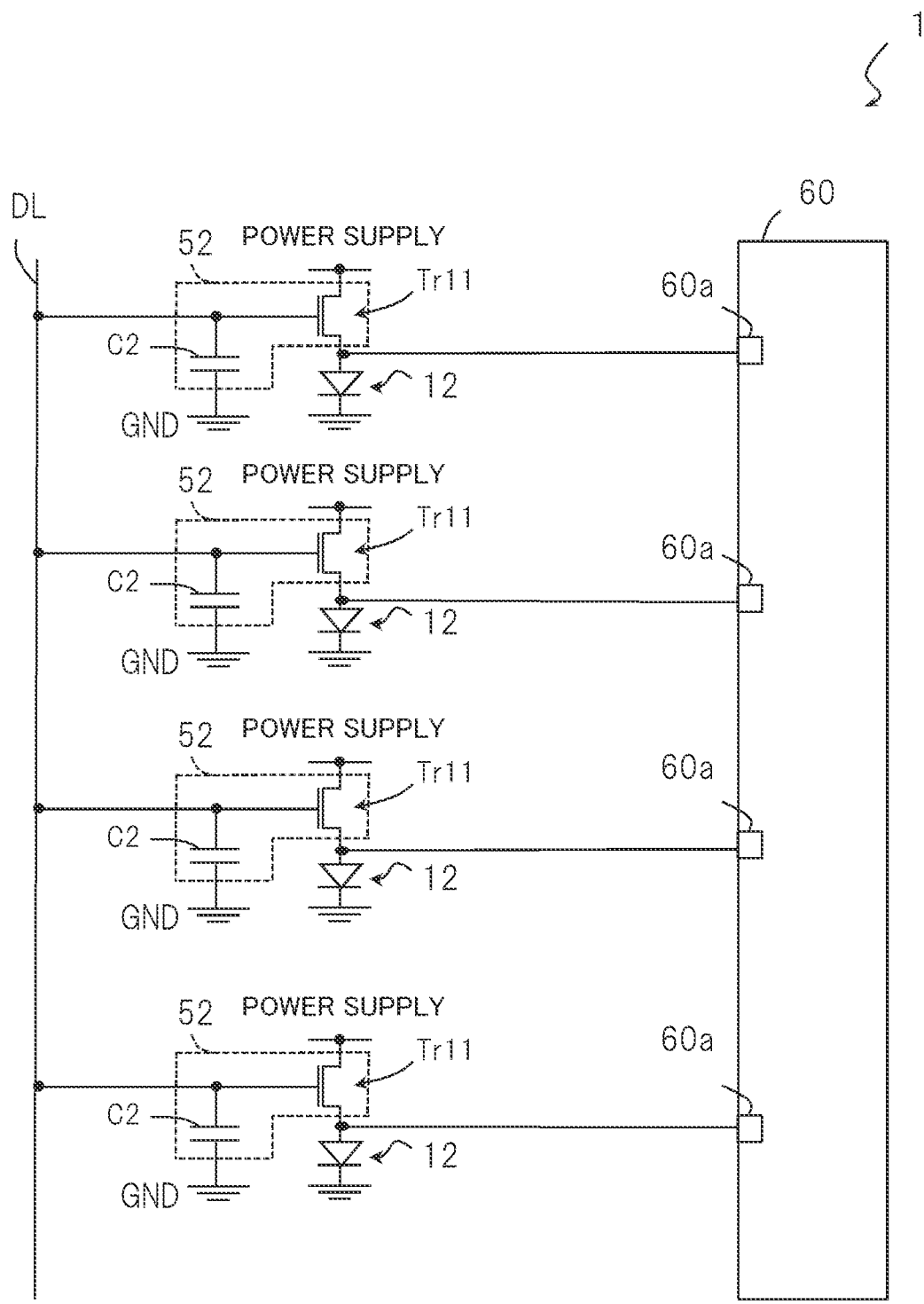
FIG. 21 is a diagram representing an exemplary circuit configuration of the plurality of first pixel circuits in the one set of first pixel circuits in accordance with Variation Example 2 of the embodiment.

Note that, for example, the number of the plurality of compact light-emitting elements 12 contained in the one set of compact light-emitting elements 13 may be equal to 2 or 4 (FIGS. 20 and 21). In other words, the count by which the first electrode 28 is divided into the plurality of first electrodes 27 in the one set of compact light-emitting elements 13 may be equal to 2 or 4.

In addition, the one set of compact light-emitting elements 13, the main light-emitting elements 11, and the plurality of compact light-emitting elements 12 contained in the one set of compact light-emitting elements 13 all appear rectangular in a plan view in FIG. 1 as an example, but may have any non-rectangular shape, including square and elliptic, in a plan view.

The one set of compact light-emitting elements 13 emits light of the same color as does the main light-emitting element 11. In other words, the plurality of compact light-emitting elements 12 contained in the one set of compact light-emitting elements 13 emit light of the same color. In addition, the plurality of compact light-emitting elements 12 contained in the one set of compact light-emitting elements 13 emit light of the same color as does the main light-emitting element 11.

For instance, the one set of compact light-emitting elements 13 is a set of compact light-emitting elements 13r that emits light of the same color (red) as do the main light-emitting elements 11r. In other words, for example, the plurality of compact light-emitting elements 12 contained in the one set of compact light-emitting elements 13 is a plurality of compact light-emitting elements 12r that emit light of the same color (red) as do the main light-emitting elements 11r.

Note that the "light emitted of the same color" means that the emitted light appears to have the same color, the peak wavelengths are in a wavelength range of the same color, or there exists wavelengths where the emission wavelength ranges overlap.

For instance, when the peak wavelength of the color of emitted light is in a wavelength range of from 600 nm exclusive to 780 nm inclusive, the light can be regarded as being red "light emitted of the same color." In addition, for example, when the peak wavelength of the color of emitted light is in a wavelength range of from 500 nm exclusive to 600 nm inclusive, the light can be regarded as being green "light emitted of the same color." In addition, for example, when the peak wavelength of the color of emitted light is in a wavelength range of from 400 nm to 500 nm both inclusive, the light can be regarded as being blue "light emitted of the same color."

A plurality of thin film transistors (drive transistors) Tr11 are disposed adjacent to the one set of compact light-emitting elements 13. The plurality of thin film transistors Tr11 are switching elements for turning on and off the plurality of compact light-emitting elements 12 respectively and connected to the plurality of compact light-emitting elements 12 respectively.

Figure 2:
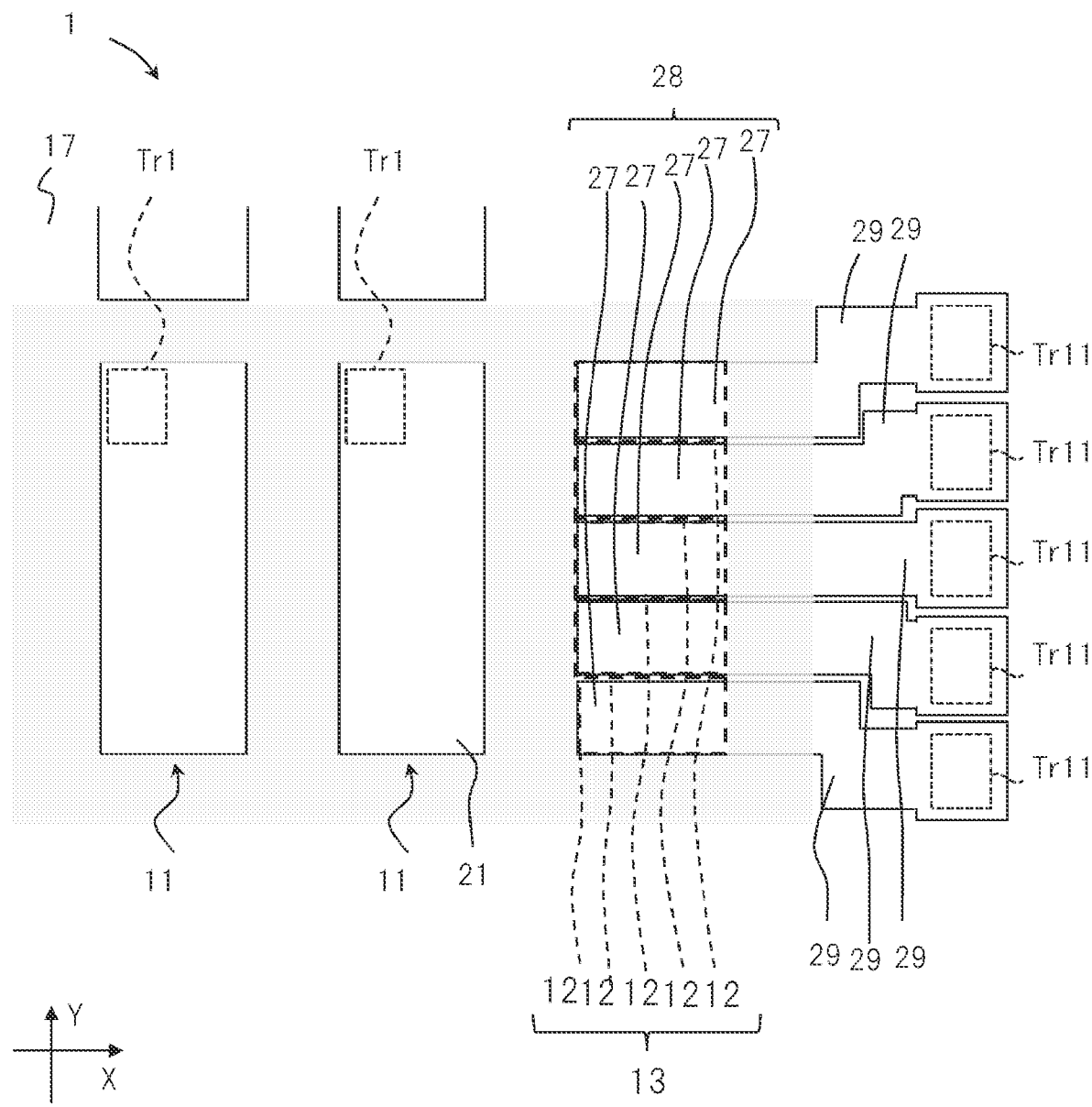
FIG. 2 is a schematic plan view of a structure of a main light-emitting element and a set of compact light-emitting elements in accordance with the embodiment.
Figure 3:
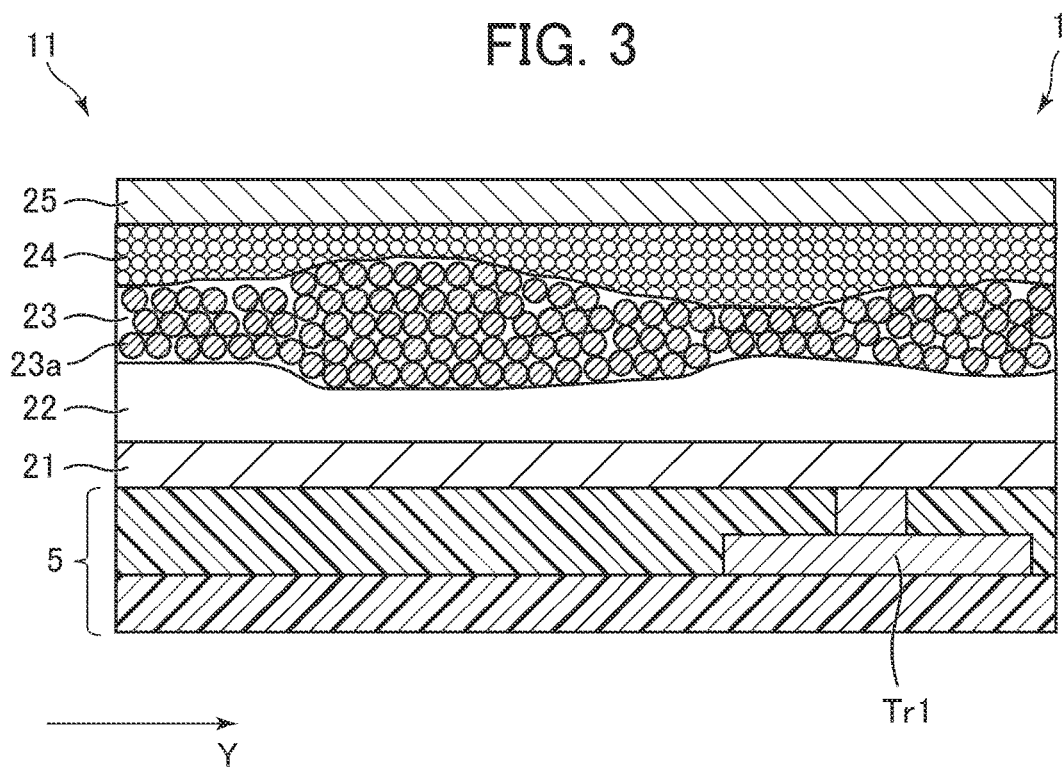
FIG. 3 is a schematic cross-sectional view of a structure of the main light-emitting element in accordance with the embodiment.
Figure 4:
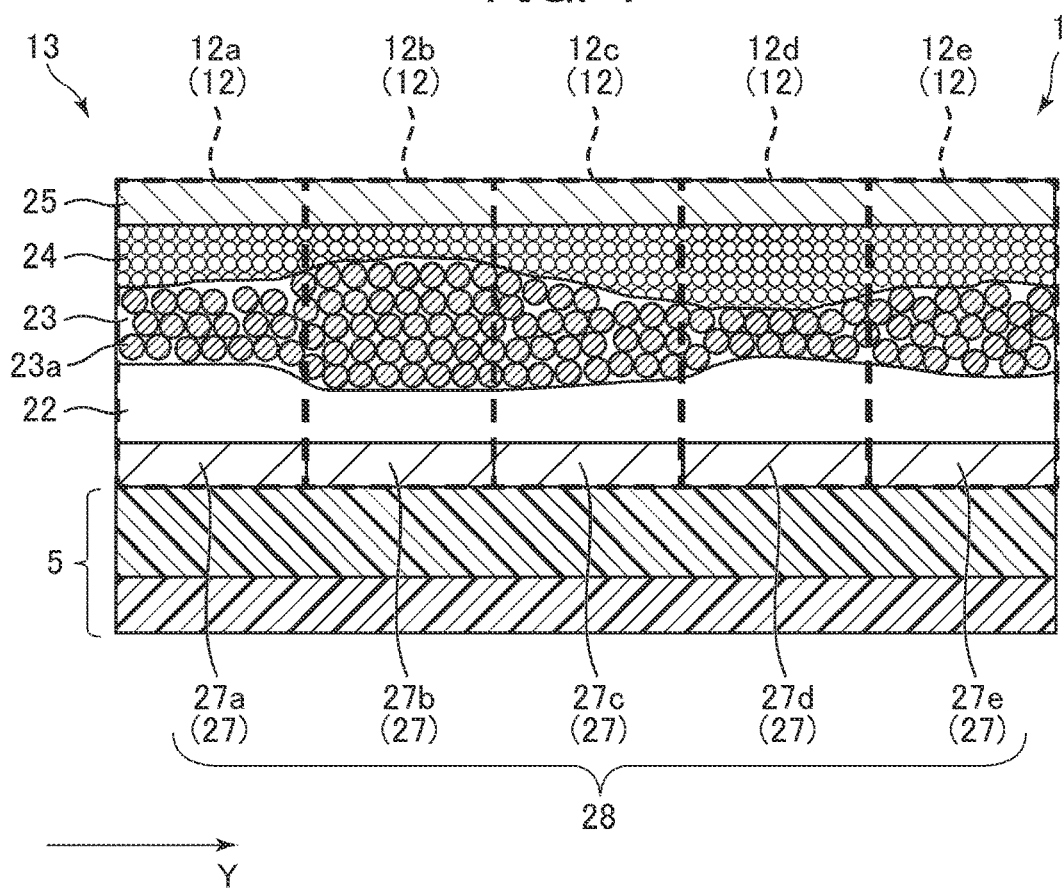
FIG. 4 is a schematic cross-sectional view of a structure of the one set of compact light-emitting elements in accordance with the embodiment.

FIG. 2 is a schematic plan view of a structure of the main light-emitting element 11 and the one set of compact light-emitting elements 13 in accordance with the embodiment. FIG. 3 is a schematic cross-sectional view of a structure of the main light-emitting element 11 in accordance with the embodiment. FIG. 4 is a schematic cross-sectional view of a structure of the one set of compact light-emitting elements 13 in accordance with the embodiment. Note that FIGS. 3 and 4 also show film thickness non-uniformities that are part of the film non-uniformities of a light-emitting layer 23 in each of the main light-emitting elements 11 and the one set of compact light-emitting elements 13. These film thickness non-uniformities and other film non-uniformities of the light-emitting layer 23 will be detailed later with reference to FIGS. 3 to 8.

The display device 1 includes an array substrate 5 and a bank 17 on the array substrate 5, as well as the plurality of main light-emitting elements 11 and the one set of compact light-emitting elements 13.

The bank 17 is stacked on the array substrate 5 so as to partition the plurality of main light-emitting elements 11 and the one set of compact light-emitting elements 13. The bank 17 may contain, for example, an insulating material such as polyimide or acrylic. The regions surrounded by the bank 17 are pixels.

The array substrate 5 includes thereon: a plurality of thin film transistors (drive transistors) Tr1 for controlling the emission and non-emission of the plurality of main light-emitting elements 11; and the plurality of thin film transistors Tr11 for controlling the emission and non-emission of each of the plurality of compact light-emitting elements 12 contained in the one set of compact light-emitting elements 13.

Here, the characteristics of the thin film transistors tend to have variations from one transistor to another when the transistors have smaller areas. Accordingly, the area of each of the plurality of thin film transistors Tr11 connected respectively to the plurality of compact light-emitting elements 12 contained in the one set of compact light-emitting elements 13 is preferably substantially equal to the area of the thin film transistor Tr1 connected to the main light-emitting element 11. This configuration enables stabilizing the characteristics of the plurality of thin film transistors Tr11 as approximately to the same level as the characteristics of the thin film transistors Tr1. The configuration can hence stabilize the driving of each of the plurality of compact light-emitting elements 12 as approximately to the same level as the driving of the main light-emitting elements 11.

The array substrate 5 includes, for example: a flexible base member; an inorganic insulating layer stacked on the base member; the plurality of thin film transistors Tr1 and Tr11 provided on the inorganic insulating layer; and an interlayer insulating layer stacked on the inorganic insulating layer and covering the plurality of thin film transistors Tr1 and Tr11.

The flexible base member may contain, for example, an organic insulating material such as polyimide. The inorganic insulating layer may have either a monolayer or multilayer structure and contain, for example, silicon oxide, silicon nitride, or silicon oxynitride. The interlayer insulating layer may contain, for example, an organic insulating material such as polyimide or acrylic. The flexible array substrate 5 can be thus structured. Note that the array substrate 5 may include a rigid base member containing an inorganic insulating material such as glass, in place of the flexible base member.

For instance, the main light-emitting element 11 includes a first electrode 21, a first charge transport layer 22, the light-emitting layer 23, a second charge transport layer 24, and a second electrode 25, all of which are sequentially stacked when viewed from the array substrate 5. In addition, for example, the one set of compact light-emitting elements 13 includes the first electrode 28, the first charge transport layer 22, the light-emitting layer 23, the second charge transport layer 24, and the second electrode 25, all of which are sequentially stacked when viewed from the array substrate 5.

For instance, the first electrode 21 in the main light-emitting element 11 is made of the same material, and provided in the same step, as the first electrode 28 in the one set of compact light-emitting elements 13. In addition, all the first charge transport layers 22 in the main light-emitting elements 11 and the one set of compact light-emitting elements 13 are, for example, made of the same material and provided in the same step. In addition, all the light-emitting layers 23 in the main light-emitting elements 11 and the one set of compact light-emitting elements 13 are, for example, made of the same material and provided in the same step. In addition, all the second charge transport layers 24 in the main light-emitting elements 11 and the one set of compact light-emitting elements 13 are, for example, made of the same material and provided in the same step. In addition, all the second electrodes 25 in the main light-emitting elements 11 and the one set of compact light-emitting elements 13 are, for example, made of the same material and provided in the same step. By making of the same material, and provided in the same step, for example, at least one of the first charge transport layers 22, the light-emitting layers 23, and the second charge transport layers 24 in the main light-emitting elements 11 and the one set of compact light-emitting elements 13 in this manner, the levels of emission non-uniformities of the layers can be made identical across the main light-emitting elements 11 and the one set of compact light-emitting elements 13, which in turn enables high-precision defective-product screening and light-emission-luminance correction.

In the present embodiment, for example, in the main light-emitting elements 11, the first electrode 21 is an anode and a reflective electrode, and the second electrode 25 is a cathode and a transparent electrode. In addition, for example, the first charge transport layer 22 is a hole transport layer, and the second charge transport layer 24 is an electron transport layer.

In addition, for example, in the one set of compact light-emitting elements 13, the first electrode 28 is an anode and a reflective electrode, and the second electrode 25 is a cathode and a transparent electrode.

Here, of the transparent electrode and the reflective electrode, the transparent electrode is provided in the main light-emitting elements 11 or the one set of compact light-emitting elements 13 on a side where the light emitted by the light-emitting layer 23 is extracted out of the main light-emitting elements 11 or the one set of compact light-emitting elements 13. The transparent electrode has a high transmittance to visible light. The transparent electrode with a high transmittance to visible light may be made of, for example, ITO, IZO, ZnO, AZO, or GZO. In addition, the transparent electrode may be provided by, for example, sputtering or vapor deposition. Note that the transparent electrode is preferably made of, for example, a material that exhibits a transmittance of greater than or equal to 80% to visible light. This particular configuration enables extracting more emitted light from the light-emitting layer 23.

In addition, of the transparent electrode and the reflective electrode, the reflective electrode is provided in the main light-emitting elements 11 or the one set of compact light-emitting elements 13, opposite the electrode provided on a side where the light emitted by the light-emitting layer 23 is extracted out of the main light-emitting elements 11 or the one set of compact light-emitting elements 13. In other words, the reflective electrode is provided in the main light-emitting elements 11 or the one set of compact light-emitting elements 13 and reflects the light emitted by the light-emitting layer 23.

The reflective electrode may contain, for example, a reflective metal layer that has a high reflectance to visible light. The reflective metal layer with a high reflectance to visible light may contain, for example, a metal such as Al, Cu, Au, or Ag. Note that the reflective metal layer is preferably made of, for example, a material with a reflectance of greater than or equal to 80% to visible light. This particular configuration enables extracting more emitted light from the light-emitting layer 23.

In addition, each of the first electrodes 21, 28 may contain a transparent conductive layer that has a high transmittance to visible light as well as a reflective metal layer. The transparent conductive layer may contain, for example, a transparent conductive material such as ITO (indium tin oxide), IZO (indium zinc oxide), ZnO (zinc oxide), AZO (aluminum-doped zinc oxide), or GZO (gallium-doped zinc oxide). Note that the transparent conductive layer is preferably made of, for example, a material with a transmittance of greater than or equal to 80% to visible light. This particular configuration enables extracting more emitted light from the light-emitting layer 23.

Each layer of the first electrodes 21, 28 can be provided by, for example, sputtering or vapor deposition. Note that the first electrodes 21, 28 do not necessarily have a two-layered structure and may have a multilayer structure with a three or more stacked layers and may have a monolayer structure.

Note that in the main light-emitting element 11, the first electrode 21 may be a cathode and a reflective electrode, and the second electrode 25 may be an anode and a transparent electrode. In addition, in the one set of compact light-emitting elements 13, the first electrode 28 may be a cathode and a reflective electrode, and the second electrode 25 may be an anode and a transparent electrode. In these cases, the first charge transport layer 22 is an electron transport layer, and the second charge transport layer 24 is a hole transport layer.

In the present embodiment, for example, the main light-emitting elements 11 and the one set of compact light-emitting elements 13 emit light by a so-called electroluminescence (EL) technique whereby the quantum dots in the light-emitting layers 23 in the main light-emitting elements 11 and the one set of compact light-emitting elements 13 emit light when current flows between the first electrode 21 and the second electrode 25, and current also flows between the first electrode 28 and the second electrode 25.

Note that in the present disclosure, "quantum dots" refers to dots with a maximum width of from 1 nm to 100 nm both inclusive. The shape of the quantum dots in the present disclosure is not limited in any particular manner as long as the shape satisfies the aforementioned maximum width and is not necessarily spherical (cross-section is circular). The quantum dots in the present disclosure may be shaped like, for example, a polygon in cross section, a bar, or a branch, have an irregular surface, or have a combination of these shapes.

For instance, in the main light-emitting elements 11, the first electrode 21, the first charge transport layer 22, the light-emitting layer 23, and the second charge transport layer 24 are respectively provided in an insular manner separately in each of the plurality of main light-emitting elements 11. For instance, in the one set of compact light-emitting elements 13, the first electrode 28, the first charge transport layer 22, the light-emitting layer 23, and the second charge transport layer 24 are respectively provided in an insular manner separately from the main light-emitting element 11.

In addition, for example, the second electrode 25 is not divided for each of the plurality of main light-emitting elements 11 and the one set of compact light-emitting elements 13, but provided as a continuous layer straddling each of the plurality of main light-emitting elements 11 and the one set of compact light-emitting elements 13.

For instance, the first electrode 28 is divided into the plurality of first electrodes 27 in the one set of compact light-emitting elements 13. The plurality of first electrodes 27 are provided in each of the plurality of compact light-emitting elements 12 contained in the one set of compact light-emitting elements 13. For instance, in the one set of compact light-emitting elements 13, the first charge transport layer 22, the light-emitting layer 23, the second charge transport layer 24, and the second electrode 25 are not divided for each of the plurality of compact light-emitting elements 12, but provided a single piece (in other words, as a layer continuous with the plurality of compact light-emitting elements 12).

For instance, in the main light-emitting element 11, the first electrode 21 injects holes to the first charge transport layer 22. In the main light-emitting element 11, the first electrode 21 is connected to the thin film transistor Tr1 that sits below an interlayer insulating layer via a contact hole formed through the interlayer insulating layer.

For instance, in the one set of compact light-emitting elements 13, each of the plurality of first electrodes 27 injects holes to the first charge transport layer 22.

Each of the plurality of first electrodes 27 is connected to a plurality of wiring lines 29, and the plurality of wiring lines 29 extend from the one set of compact light-emitting elements 13 to locations overlapping the plurality of thin film transistors Tr11 provided outside the one set of compact light-emitting elements 13. Then, each of the plurality of wiring lines 29 is connected to the plurality of thin film transistors Tr11 provided below an interlayer insulating layer at locations overlapping the plurality of thin film transistors Tr11 via a contact hole formed through the interlayer insulating layer. In other words, each of the plurality of first electrodes 27 is connected to the plurality of thin film transistors Tr11 via the plurality of wiring lines 29. The plurality of wiring lines 29 are provided in the same layer as the plurality of first electrodes 27. For instance, the plurality of wiring lines 29 may be made of the same material, and provided in the same step, as the plurality of first electrodes 27.

The first charge transport layer 22 is, for example, a hole transport layer. In the main light-emitting element 11, the first charge transport layer 22 transports holes injected from the first electrode 21 to the light-emitting layer 23. In the one set of compact light-emitting elements 13, the first charge transport layer 22 transports holes injected from the first electrode 28 (in other words, each of the plurality of first electrodes 27) to the light-emitting layer 23.

The first charge transport layer 22 contains, for example, a hole transport material. The first charge transport layer 22 may contain, for example, PEDOT:PSS (polyethylenedioxythiophene/polystyrene sulfonate), PVK (poly-N-vinyl carbazole), TFB (poly[(9,9-dioctylfluorenyl-2,7-diyl)-co-(4,4'-(N-(4-sec-butylphenyl)diphenylamine))]), or poly-TPD (N,N'-bis(4-butylphenyl)-N,N'-bis(phenyl)-benzidine) and may contain two or more of these materials.

The first charge transport layer 22 may be formed by, for example, inkjet printing-based coating with different materials, vapor deposition using a mask, or photolithography.

The light-emitting layer 23 contains a plurality of quantum dots 23a. The plurality of quantum dots 23a emit, for example, red light. Note that the plurality of quantum dots 23a contained in the light-emitting layer 23 do not necessarily emit red light and may emit light of another color such as green light or blue light.

The light-emitting layer 23 may be formed by, for example, inkjet printing-based coating with different materials, vapor deposition using a mask, or photolithography.

The plurality of quantum dots 23a may be semiconductor nanoparticles. The plurality of quantum dots 23a have a valence band energy level (equal to the ionization potential) and a conduction band energy level (equal to the electron affinity) and may be made of a light-emitting material that emits light upon recombination of holes on the valence band energy level and electrons on the conduction band energy level. Since the light emitted by quantum dots that have equal particle diameters has a narrow spectrum due to the quantum confinement effect, the emitted light exhibits relatively deep chromaticity.

The plurality of quantum dots 23a may contain, for example, one or more semiconductor materials selected from the group consisting of CdS, CdSe, CdTe, ZnS, ZnSe, ZnTe, InN, InP, InAs, InSb, AlP, AlS, AlAs, AlSb, GaN, GaP, GaAs, GaSb, PbS, PbSe, Si, Ge, MgS, MgSe, MgTe, and combinations of these materials. In addition, quantum dots 16r, 16g, 16b may have a two-component core structure, a three-component core structure, a four-component core structure, a core-shell structure, a core-multishell structure, a doped nanoparticle structure, or a composition-gradient structure. In addition, for example, a ligand may be coordinately bonded to an outer peripheral portion of the shell. The ligand may be made of, for example, an organic material such as thiol or amine.

The particle diameters of the plurality of quantum dots 23a may be, for example, approximately from 3 nm to 15 nm. The emission wavelength (peak wavelength) of the plurality of quantum dots 23a are controllable through the particle diameter. Therefore, the emission of red, green, or blue light is achieved by controlling the particle diameters of the plurality of quantum dots 23a.

For instance, the plurality of quantum dots 23a contained in the light-emitting layer 23 in the main light-emitting element 11 contain the same type of material as the plurality of quantum dots 23a contained in the light-emitting layer 23 in the one set of compact light-emitting elements 13.

Here, the "same type of material" may be the case of (i) and (ii) or the case of (i) and (iii) among, for example, (i) the same compound (composition ratio), (ii) the quantum dots 23a having substantially the same average particle diameter, (iii) the quantum dots 23a including cores having substantially the same average particle diameter. Note that "substantially" refers to ±20%. The "average particle diameter" may be defined as an average of the calculated diameters of circles corresponding to the areas of the cross-sections of 10 closely located particles when any cross-section of the light-emitting layer 23 is observed.

In addition, when the core is ZnSe, $\{6.1/[(1240/\lambda p)-2.7]\}^{(1/2)}$ corresponds to the core diameter calculated using an effective-mass approximation on ZnSe, where $\lambda p$ (nm) is the PL peak wavelength of the quantum dots. This value can be used (regarded) as the core diameter. In addition, when the material differs, the core diameter can be calculated from the PL peak wavelength using a similar approximation.

The second charge transport layer 24 is, for example, an electron transport layer. The second charge transport layer 24 transports electrons injected from the second electrode 25 to the light-emitting layer 23. The second charge transport layer 24 contains, for example, a plurality of electron-transporting nanoparticles. The second charge transport layer 24 may be formed by, for example, inkjet printing-based coating with different materials, vapor deposition using a mask, or photolithography.

Note that the second charge transport layer 24 may have a function of restraining holes from being transported from the light-emitting layer 23 to the second electrode 25.

The second electrode 25 injects electrons to the second charge transport layer 24. The second electrode 25 is disposed opposite the first electrode 21 with respect to the light-emitting layer 23. In other words, the second electrode 25 is stacked on the second charge transport layer 24 and the bank 17. For instance, the second electrode 25 is a common electrode that is continuous over the main light-emitting element 11 and the one set of compact light-emitting elements 13. For instance, the second electrode 25 is "provided as a common layer" across the entire display area 10, the common layer being continuous across the entire display area 10 of the display device 1.

In addition, there is provided a sealing layer (not shown) on the second electrode 25. The sealing layer includes, for example: a first inorganic sealing layer covering the second electrode 25; an organic buffer layer stacked overlying the first inorganic sealing layer; and a second inorganic sealing layer stacked overlying the organic buffer layer. The sealing layer prevents permeation of the display device 1 by foreign objects such as water and oxygen.

Each of the first inorganic sealing layer and the second inorganic sealing layer may have either a monolayer structure using an inorganic insulating material such as a silicon oxide layer, a silicon nitride layer, or a silicon oxynitride layer or a multilayer structure that includes a combination of any of these layers. Each of the first inorganic sealing layer and the second inorganic sealing layer may be formed by, for example, CVD.

The organic buffer layer has a planarization effect and is, for example, a transparent resin layer that transmits visible light. The organic buffer layer may contain an organic material, such as acrylic, that can be provided by printing or coating technology. In addition, there may be provided a functional film (not shown) on the sealing layer. The functional film may have, for example, at least one of optical compensation functionality, touch sensor functionality, and protection functionality.

The electrons inject from the second electrode 25 to the second charge transport layer 24 are further transported from the second charge transport layer 24 to the light-emitting layer 23.

In addition, in the main light-emitting element 11, the holes injected from the first electrode 21 to the first charge transport layer 22 are further transported from the first charge transport layer 22 to the light-emitting layer 23. In addition, in the one set of compact light-emitting elements 13, the holes injected from the plurality of first electrodes 27 to the first charge transport layer 22 are further transported from the first charge transport layer 22 to the light-emitting layer 23.

Then, in the main light-emitting element 11 and the one set of compact light-emitting elements 13, the electrons and holes transported to the light-emitting layer 23 recombine in the plurality of quantum dots 23a, to generate excitons. Then, the plurality of quantum dots 23a emit light when these excitons transition from the excited state back to the ground state. In other words, the plurality of quantum dots 23a in the light-emitting layer 23 emit, for example, red light.

For instance, the display device 1 has a top-emission structure where the light emitted by the light-emitting layer 23 is transmitted through the second charge transport layer 24 and the second electrode 25 for extraction to the side opposite the array substrate 5 (the upper side of the light-emitting layer 23 in FIGS. 3 and 4). Note that the display device 1 may have a bottom-emission structure where the light emitted by the light-emitting layer 23 is transmitted through the first charge transport layer 22, the first electrode 21, and the array substrate 5 for extraction to the array substrate 5 side (the lower side of the light-emitting layer 23 in in FIGS. 3 and 4). When the display device 1 has a bottom-emission structure, the second electrode 25 needs only to contain a reflective metal layer that has a high reflectance to visible light, and the first electrode 21 needs only to contain a transparent conductive layer that has a high transmittance to visible light.

Note that each of the main light-emitting elements 11 and the one set of compact light-emitting elements 13 does not necessarily have the layered structure shown in FIGS. 3 and 4, and, for example, each of the main light-emitting elements 11 and the one set of compact light-emitting elements 13 may include yet another functional layer. For instance, the main light-emitting elements 11 and the one set of compact light-emitting elements 13 may include, between the first electrode 21 and the first charge transport layer 22, a hole injection layer for increasing the efficiency of hole injection from the first electrode 21 to the first charge transport layer 22. In addition, for example, the main light-emitting elements 11 and the one set of compact light-emitting elements 13 may include, between the second electrode 25 and the second charge transport layer 24, an electron injection layer for increasing the efficiency of electron injection from the second electrode 25 to the second charge transport layer 24.

Here, as described above, when the light-emitting layer 23 is injected with electrons and holes, the plurality of quantum dots 23a in the light-emitting layer 23 emit light. Therefore, the light-emitting layer 23 easily changes the luminous efficiency thereof due to non-uniformities in the film condition and as a result, easily develops in-plane luminance non-uniformities due to the non-uniformities in the film condition. In particular, the light-emitting layer 23, if formed by, for example, coating, easily develops non-uniformities in the film condition in comparison with a light-emitting layer formed by, for example, vapor deposition.

Accordingly, the one set of compact light-emitting elements 13 in accordance with the present embodiment has a structure that facilitates the inspection of non-uniformities in the film condition of the light-emitting layer 23.

Here, the non-uniformities in the film condition of the light-emitting layer 23 that change the luminous efficiency of the quantum dots 23a are, for example, (1) film thickness non-uniformities, (2) density non-uniformities of the plurality of quantum dots, (3) non-uniformities of the gaps at the interface between the light-emitting layer 23 and the electron transport layer (second charge transport layer 24) that is in contact with the light-emitting layer 23, and (4) non-uniformities of the gaps at the interface between the light-emitting layer 23 and the hole transport layer (first charge transport layer 22) that is in contact with the light-emitting layer 23.

A description is given now of non-uniformities in the film condition of the light-emitting layer 23 with reference to FIGS. 3 to 8. Note that there could be cases where, for example, the electron transport layer (second charge transport layer 24) contains nanoparticles containing, for example, ZnO and easily develops non-uniformities of the gaps between the nanoparticles, and in contrast, the hole transport layer (first charge transport layer 22) is less likely to develop non-uniformities of the gaps than a nanoparticle-containing layer because the hole transport layer has a larger length where molecules are bonded than a nanoparticle-containing layer in comparison with a case where nanoparticles are contained.

Then, in these cases, there are cases where the non-uniformities of the gaps are larger at the interface between nanoparticle-containing layers, in other words, between the electron transport layer (second charge transport layer 24) and the light-emitting layer 23 containing the quantum dots 23a than at the interface between the hole transport layer (first charge transport layer 22) and the light-emitting layer 23.

FIG. 3, as described above, illustrates a condition of film thickness non-uniformities of the light-emitting layer 23 of the main light-emitting elements 11. FIG. 4 illustrates a condition of film thickness non-uniformities of the light-emitting layer 23 in the one set of compact light-emitting elements 13.

An increase in the thickness of the light-emitting layer 23 causes electrical resistance to grow between the first electrodes 27 and the second electrode 25 and the drive voltage for causing a prescribed current to increase. In addition, a decrease in the thickness of the light-emitting layer 23 causes electrical resistance to fall between the first electrodes 27 and the second electrode 25 and the drive voltage for causing a prescribed current to decrease.

Referring to FIG. 3, in many cases, the length of the longer side of the main light-emitting element 11 is larger than the pitch of the film thickness non-uniformities of the light-emitting layer 23. For this reason, even if the light-emitting layer 23 in the main light-emitting element 11 includes a region where the thickness is large and a region where the thickness is small, the main light-emitting element 11 exhibits such current-voltage characteristics (J-V characteristics) and light emission luminance-current characteristics (L-J characteristics) that the film thickness non-uniformities of the light-emitting layer 23 are averaged out in the main light-emitting element 11.

Referring to FIG. 4, the one set of compact light-emitting elements 13 includes the plurality of compact light-emitting elements 12. In other words, the first electrode 28 in the one set of compact light-emitting elements 13 is divided into the plurality of first electrodes 27.

For instance, the plurality of compact light-emitting elements 12 in the one set of compact light-emitting elements 13 will be sequentially referred to as compact light-emitting elements 12a, 12b, 12c, 12d, and 12e. The first electrode 27 in the compact light-emitting element 12a will be referred to as a first electrode 27a. The first electrode 27 in the compact light-emitting element 12b will be referred to as a first electrode 27b. The first electrode 27 in the compact light-emitting element 12c will be referred to as a first electrode 27c. The first electrode 27 in the compact light-emitting element 12d will be referred to as a first electrode 27d. The first electrode 27 in the—compact light-emitting element 12e will be referred to as a first electrode 27e.

In the example shown in FIGS. 4, in the light-emitting layer 23 in the one set of compact light-emitting elements 13, the region in the compact light-emitting element 12b has a larger average thickness, and hence a larger electrical resistance, than other regions. The region in the compact light-emitting element 12d has a smaller average thickness, and hence a smaller electrical resistance, than other regions. Therefore, the drive voltage for causing a prescribed current is lower between the first electrode 27d in the compact light-emitting element 12d and a region of the second electrode 25 opposite the first electrode 27d than between the first electrode 27b in the compact light-emitting element 12b and a region of the second electrode 25 opposite the first electrode 27b.

It is thus possible to obtain information representing the drive voltage, and sense the film thickness non-uniformities of the light-emitting layer 23 in the one set of compact light-emitting elements 13, for each of the plurality of compact light-emitting elements 12, in other words, each of the plurality of first electrodes 27, in the one set of compact light-emitting elements 13.

Figure 5:
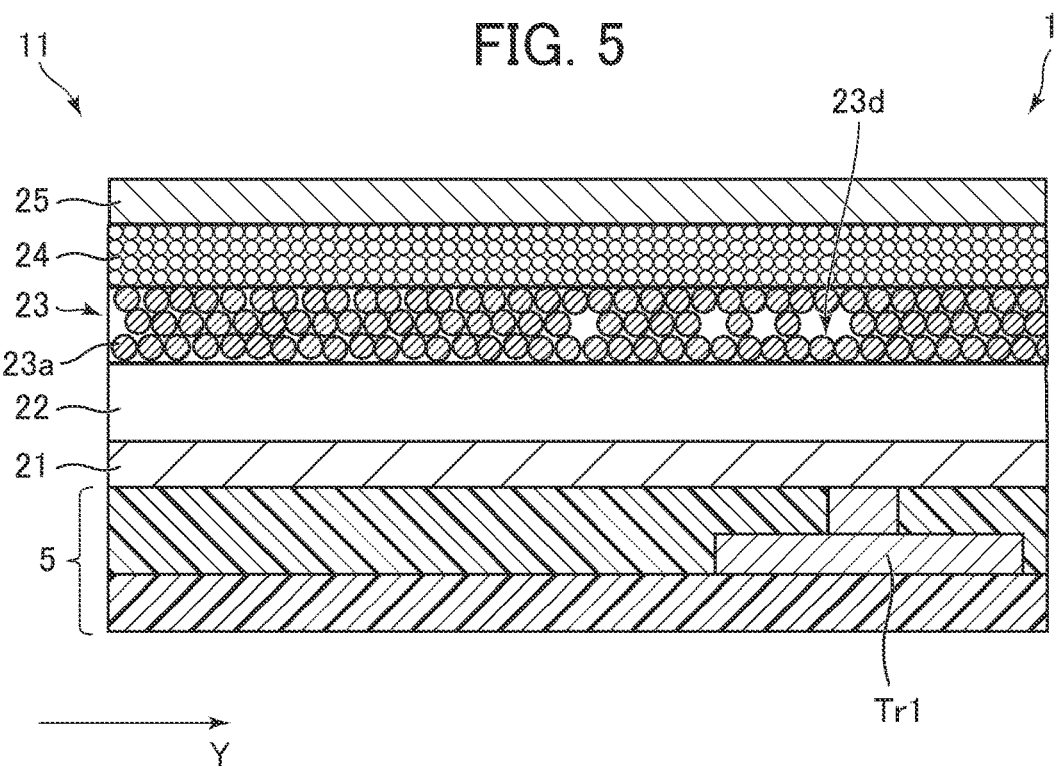
FIG. 5 is a schematic cross-sectional view of a structure of the main light-emitting element in accordance with the embodiment, illustrating density non-uniformities of a plurality of quantum dots in a light-emitting layer.
Figure 6:
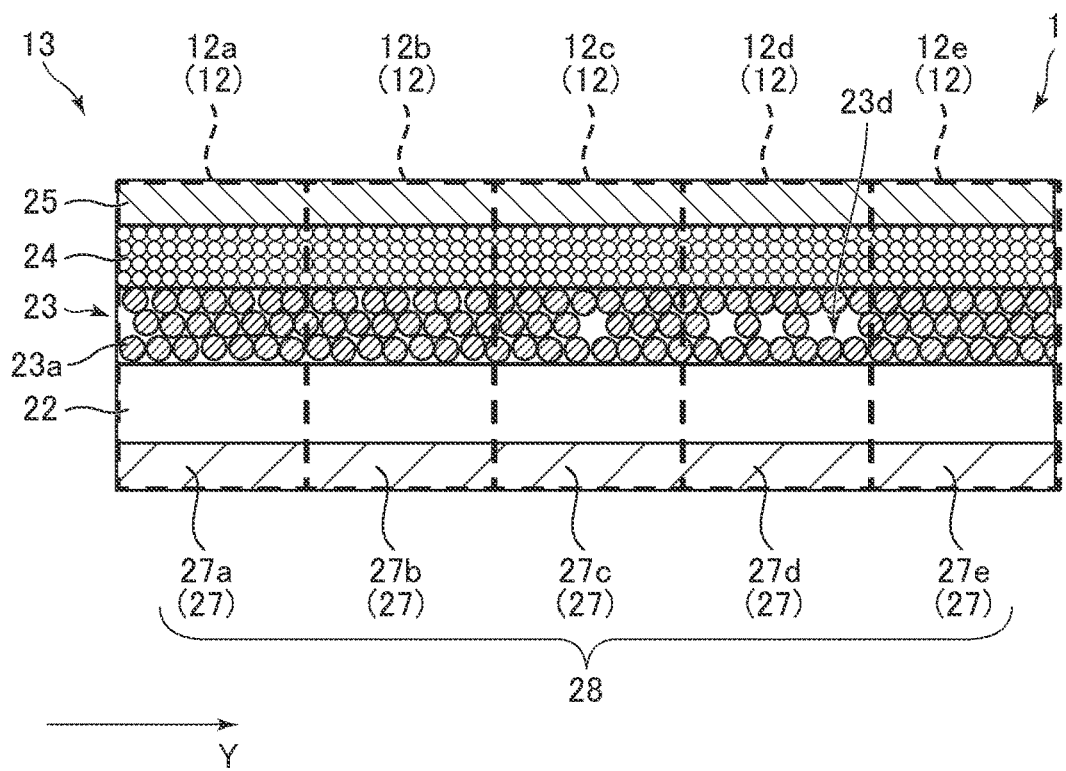
FIG. 6 is a schematic cross-sectional view of a structure of the one set of compact light-emitting elements in accordance with the embodiment, illustrating density non-uniformities of a plurality of quantum dots in a light-emitting layer.

FIG. 5 is a schematic cross-sectional view of a structure of the main light-emitting element 11 in accordance with the embodiment, illustrating density non-uniformities in the plurality of quantum dots in the light-emitting layer 23. FIG. 6 is a schematic cross-sectional view of a structure of the one set of compact light-emitting elements 13 in accordance with the embodiment, illustrating density non-uniformities of the plurality of quantum dots in the light-emitting layer 23.

With an increase in the density of the plurality of quantum dots 23a (number of the plurality of quantum dots 23a per unit volume) in the light-emitting layer 23 (in other words, dense), electrical resistance grows, and drive voltage for causing a prescribed current hence increases, between the first electrodes 21, 27 and the second electrode 25.

In addition, as shown in FIGS. 5 and 6, in the regions where there are formed large gaps 23d between the plurality of quantum dots 23a in parts of the light-emitting layer 23, the density the plurality of quantum dots 23a in the light-emitting layer 23 is low (in other words, sparse), electrical resistance changes, and drive voltage for causing a prescribed current hence changes, between the first electrodes 21, 27 and the second electrode 25.

Here, when considering the density non-uniformities of the plurality of quantum dots 23a, the magnitudes of two opposing effects (1) and (2) below need to be taken into consideration. The correlation between the density of the plurality of quantum dots 23a and the voltage varies from one case to another.

(1) The number of quantum dots varies among layers having the same thickness if the density of the quantum dots changes.

When the quantum dots have a high density, the number of the quantum dots is large, and the drive voltage applied to the light-emitting elements to cause a prescribed current (to obtain prescribed luminance) is high.

When the quantum dots have a low density, the number of the quantum dots is low, and the drive voltage applied to the light-emitting elements to cause a prescribed current (to obtain prescribed luminance) is low.

(2) The distance between the quantum dots varies if the density of the quantum dots changes.

When the quantum dots have a high density, the distance between the quantum dots is small, and the drive voltage applied to the light-emitting elements to cause a prescribed current (to obtain prescribed luminance) is low.

When the quantum dots have a low density, the distance between the quantum dots is large, and the drive voltage applied to the light-emitting elements to cause a prescribed current (to obtain prescribed luminance) is high.

Therefore, the relationship between the density of the quantum dots and the drive voltage detailed later is a mere example.

For instance, as shown in FIG. 5, in many cases, the length of the longer side of the main light-emitting element 11 is larger than the pitch of the density non-uniformities of the plurality of quantum dots 23a in the light-emitting layer 23. For this reason, even if the light-emitting layer 23 in the main light-emitting element 11 includes a region where the density of the plurality of quantum dots 23a is high and a region where the density of the plurality of quantum dots 23a is low, the main light-emitting element 11 exhibits such current-voltage characteristics (J-V characteristics) and light emission luminance-current characteristics (L-J characteristics) that the density non-uniformities of the plurality of quantum dots 23a in the light-emitting layer 23 are averaged out in the main light-emitting element 11.

In contrast, for example, as shown in FIG. 6, among the light-emitting layers 23 in the one set of compact light-emitting elements 13, the light-emitting layer 23 in the compact light-emitting element 12b contains no large gaps 23d, so that the plurality of quantum dots 23a have a high density and that the light-emitting layer 23 has a high electrical resistance. In addition, the light-emitting layer 23 in the compact light-emitting element 12d contains large gaps 23d, so that the plurality of quantum dots 23a have a low density and that the light-emitting layer 23 has a low electrical resistance.

Therefore, the drive voltage for causing a prescribed current is lower between the first electrode 27d in the compact light-emitting element 12d and a region of the second electrode 25 opposite the first electrode 27d than between the first electrode 27b in the compact light-emitting element 12b and a region of the second electrode 25 opposite the first electrode 27b.

It is thus possible to obtain the drive voltage as information, and sense the density non-uniformities of the plurality of quantum dots 23a in the light-emitting layer 23 in the one set of compact light-emitting elements 13, for each of the plurality of compact light-emitting elements 12, in other words, each of the plurality of first electrodes 27, in the one set of compact light-emitting elements 13.

Figure 7:
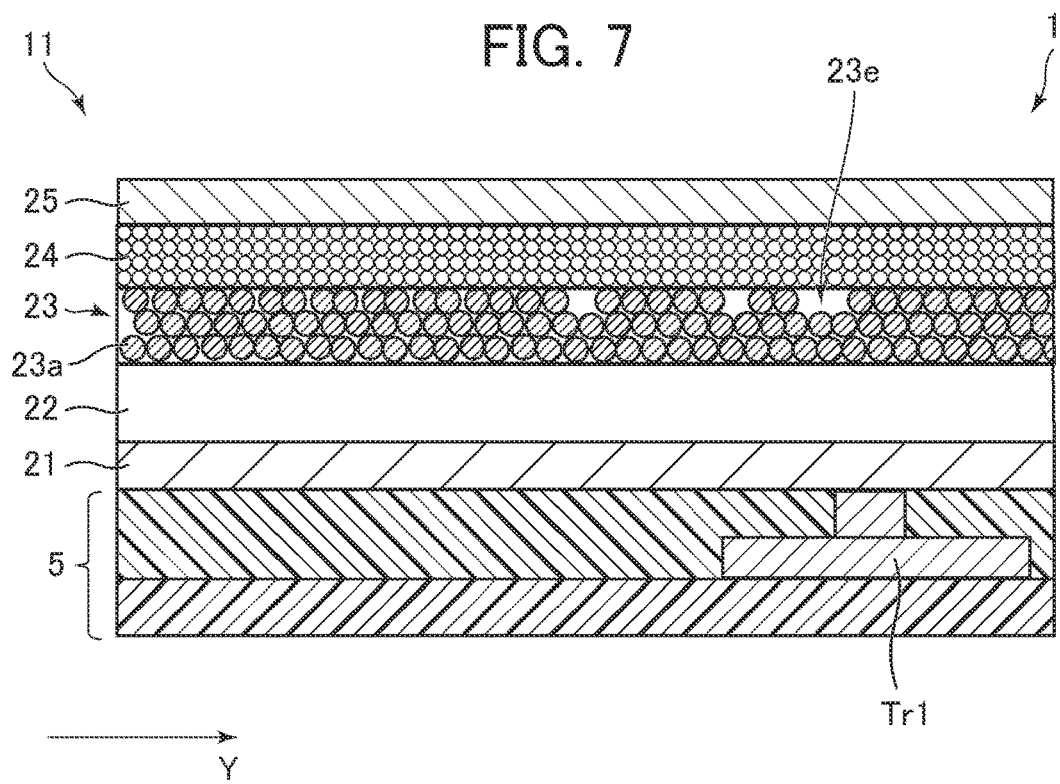
FIG. 7 is a schematic cross-sectional view of a structure of the main light-emitting element in accordance with the embodiment, illustrating gap non-uniformities at an interface between a light-emitting layer and a second charge transport layer.
Figure 8:
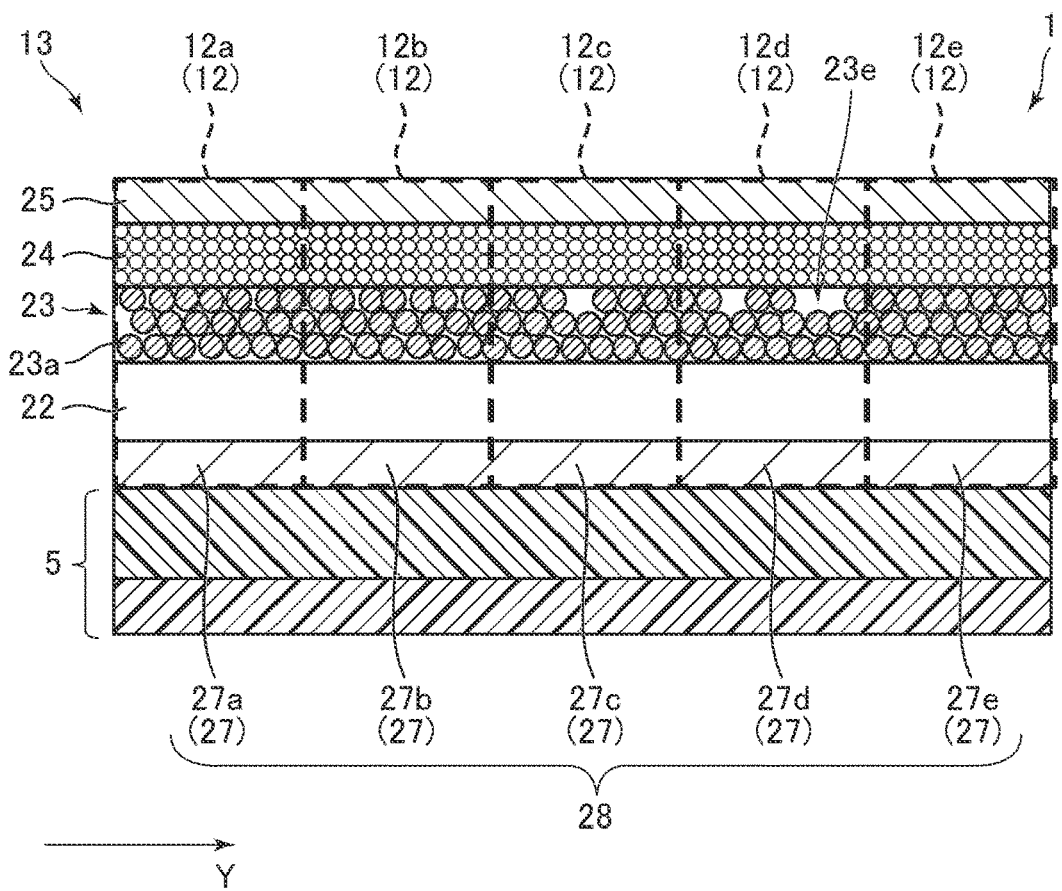
FIG. 8 is a schematic cross-sectional view of a structure of the one set of compact light-emitting elements in accordance with the embodiment, illustrating gap non-uniformities at the interface between a light-emitting layer and a second charge transport layer.

FIG. 7 is a schematic cross-sectional view of a structure of the main light-emitting element 11 in accordance with the embodiment, illustrating gap non-uniformities at an interface between the light-emitting layer 23 and the second charge transport layer 24. FIG. 8 is a schematic cross-sectional view of a structure of the one set of compact light-emitting elements 13 in accordance with the embodiment, illustrating gap non-uniformities at the interface between the light-emitting layer 23 and the second charge transport layer 24.

Referring to FIGS. 7 and 8, the electrical resistance is larger at an interface between the light-emitting layer 23 and the electron transport layer (second charge transport layer 24) in a region where gaps 23e are provided than at the interface between the light-emitting layer 23 and the electron transport layer (second charge transport layer 24) in a region where no gaps 23e are provided. Therefore, the drive voltage for causing a prescribed current is larger at the interface between the light-emitting layer 23 and the electron transport layer (second charge transport layer 24) in a region where the gaps 23e are provided than at the interface between the light-emitting layer 23 and the electron transport layer (second charge transport layer 24) in a region where no gaps 23e are provided.

For instance, as shown in FIG. 7, in many cases, the length of the longer side of the main light-emitting element 11 is larger than the pitch of the gaps 23e at the interface between the light-emitting layer 23 and the electron transport layer (second charge transport layer 24). For this reason, even if the gaps 23e are provided partially at the interface between the light-emitting layer 23 and the electron transport layer (second charge transport layer 24) in the main light-emitting element 11, the main light-emitting element 11 exhibits such current-voltage characteristics (J-V characteristics) and light emission luminance-current characteristics (L-J characteristics) that the non-uniformities of the gaps 23e at the interface between the light-emitting layer 23 and the electron transport layer (second charge transport layer 24) are averaged out in the main light-emitting element 11.

In contrast, for example, as shown in FIG. 8, among the light-emitting layers 23 in the one set of compact light-emitting elements 13, no gaps 23e are provided at the interface between the light-emitting layer 23 and the electron transport layer (second charge transport layer 24) in the compact light-emitting element 12b, so that the light-emitting layer 23 can be in intimate contact with the electron transport layer (second charge transport layer 24) and that the interface has a low electrical resistance. In addition, the gaps 23d are provided partially at the interface between the light-emitting layer 23 and the electron transport layer (second charge transport layer 24) in the compact light-emitting element 12d, so that the light-emitting layer 23 is separated from the electron transport layer (second charge transport layer 24) in portions where the gaps 23d are provided and that the interface has a large electrical resistance in these portions.

Therefore, the drive voltage for causing a prescribed current is larger between the first electrode 27d in the compact light-emitting element 12d and a region of the second electrode 25 opposite the first electrode 27d than between the first electrode 27b in the compact light-emitting element 12b and a region of the second electrode 25 opposite the first electrode 27b.

It is thus possible to obtain the drive voltage as information, and sense the non-uniformities of the gaps 23e at the interface between the light-emitting layer 23 and the electron transport layer (second charge transport layer 24) in the one set of compact light-emitting elements 13, for each of the plurality of compact light-emitting elements 12, in other words, each of the plurality of first electrodes 27, in the one set of compact light-emitting elements 13.

Figure 9:
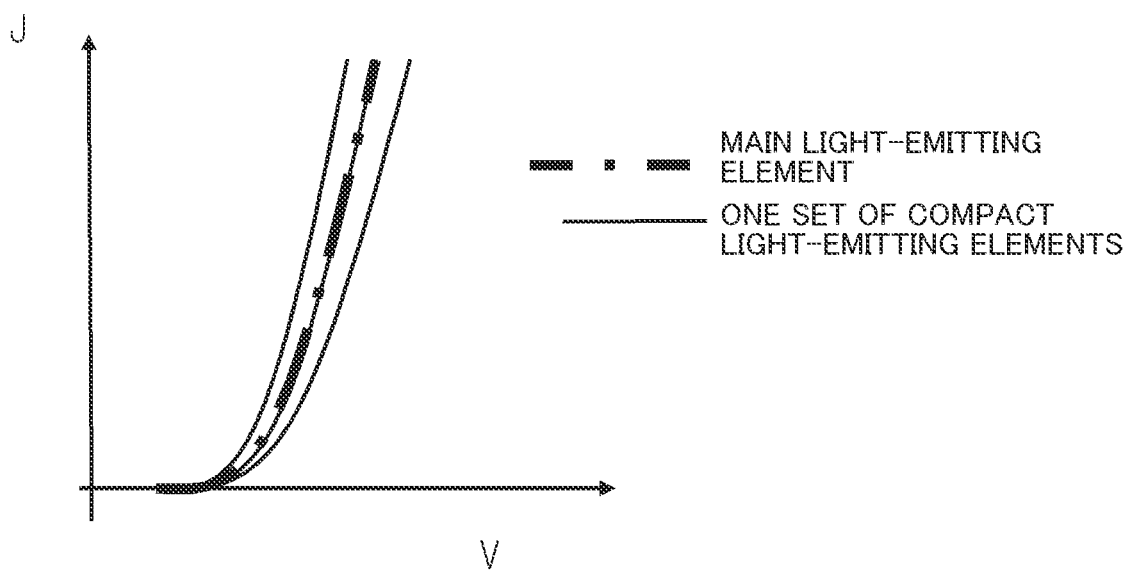
FIG. 9 is a graphical representation of current-voltage characteristics when the main light-emitting elements and the one set of compact light-emitting elements in accordance with the embodiment each include a light-emitting layer of which the film condition has non-uniformities that are within a prescribed range.
Figure 10:
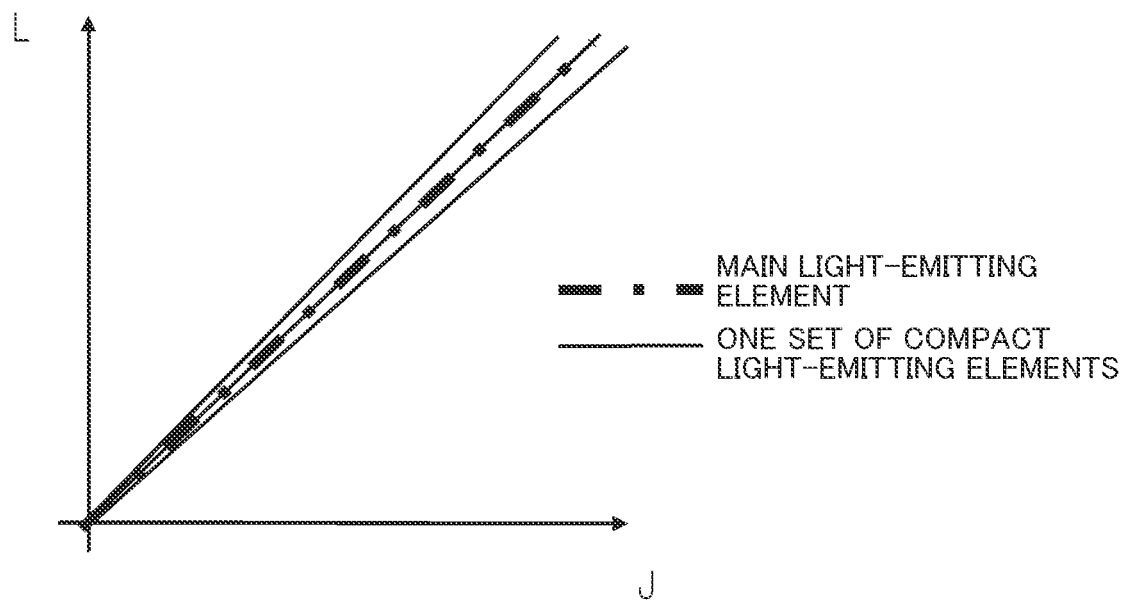
FIG. 10 is a graphical representation of light emission luminance-current characteristics when the main light-emitting elements and the one set of compact light-emitting elements in accordance with the embodiment each include a light-emitting layer of which the film condition has non-uniformities that are within the prescribed range.

FIG. 9 is a graphical representation of current-voltage characteristics (J-V characteristics) when the light-emitting layer 23 in each of the main light-emitting elements 11 and the one set of compact light-emitting elements 13 in accordance with the embodiment has a film condition that has non-uniformities that are within a prescribed range. FIG. 10 is a graphical representation of light emission luminance-current characteristics (L-J characteristics) when the light-emitting layer 23 in each of the main light-emitting elements 11 and the one set of compact light-emitting elements 13 in accordance with the embodiment has a film condition that has non-uniformities that are within a prescribed range.

Figure 11:
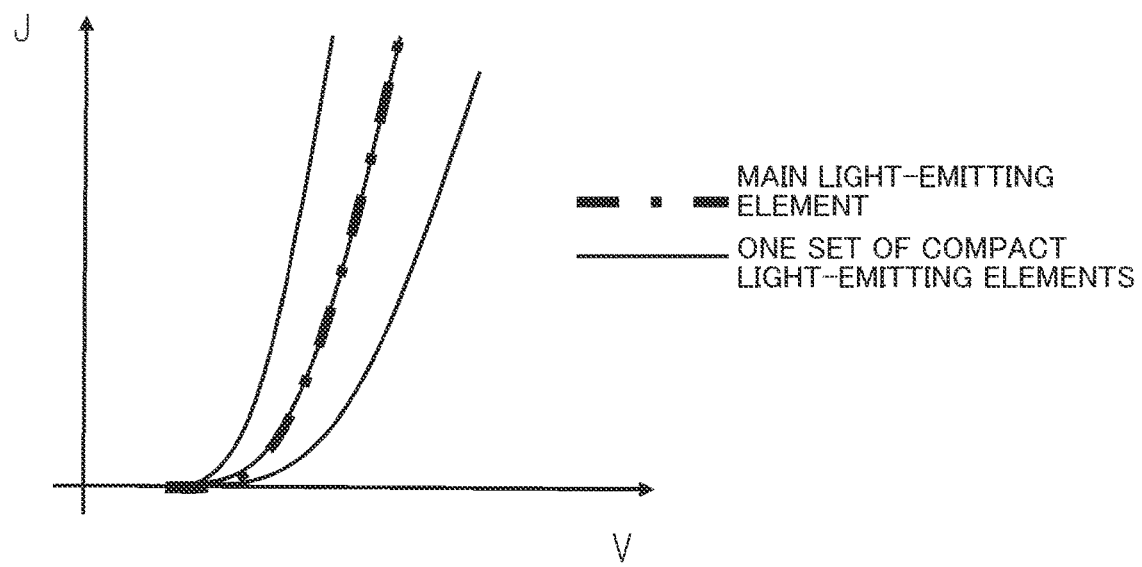
FIG. 11 is a graphical representation of current-voltage characteristics when the main light-emitting elements and the one set of compact light-emitting elements in accordance with the embodiment each include a light-emitting layer of which the film condition has non-uniformities that are out of the prescribed range.
Figure 12:
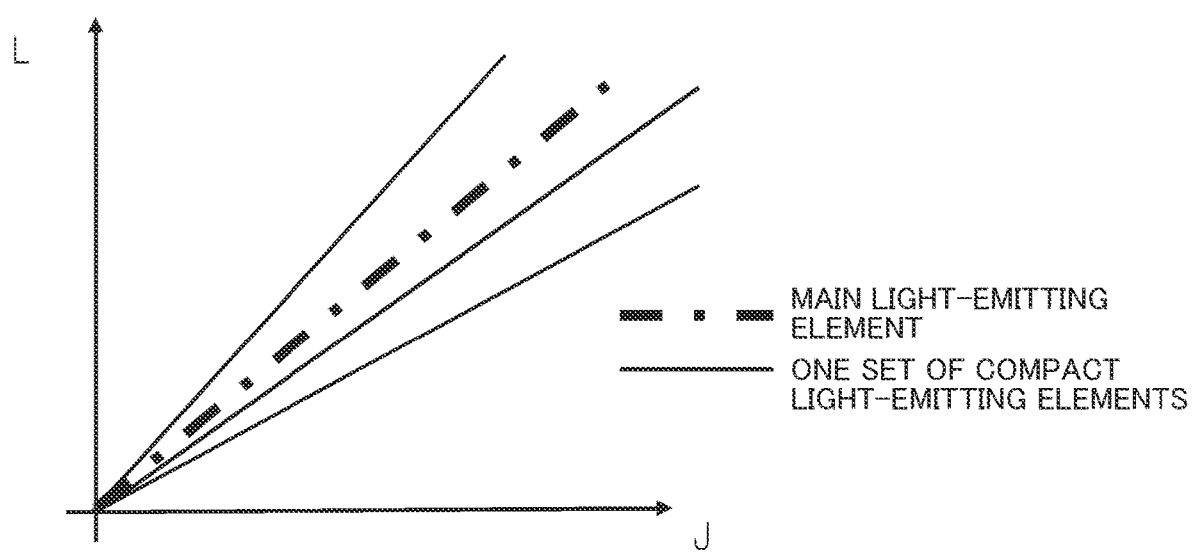
FIG. 12 is a graphical representation of light emission luminance-current characteristics when the main light-emitting elements and the one set of compact light-emitting elements in accordance with the embodiment each include a light-emitting layer of which the film condition has non-uniformities that are out of the prescribed range.

FIG. 11 is a graphical representation of current-voltage characteristics (J-V characteristics) when the light-emitting layer 23 in each of the main light-emitting elements 11 and the one set of compact light-emitting elements 13 in accordance with the embodiment has a film condition that has non-uniformities that are out of the prescribed range. FIG. 12 is a graphical representation of light emission luminance-current characteristics (L-J characteristics) when the light-emitting layer 23 in each of the main light-emitting elements 11 and the one set of compact light-emitting elements 13 in accordance with the embodiment has a film condition that has non-uniformities that are out of the prescribed range.

In FIGS. 9 and 11, the vertical axis represents electric current through the main light-emitting element 11 and the compact light-emitting element 12, and the horizontal axis represents the drive voltage supplied to the main light-emitting element 11 and the compact light-emitting element 12. In FIGS. 10 and 12, the vertical axis represents the light-emission luminance of the main light-emitting element 11 and the compact light-emitting element 12, and the horizontal axis represents electric current through the main light-emitting element 11 and the compact light-emitting element 12. Note that in the graphs in FIGS. 9 to 12, the data series for the main light-emitting element 11 are indicated by a dash-dot line, and the data series for the compact light-emitting element 12 is indicated by a solid line.

Referring to FIG. 9, if the film condition of the light-emitting layer 23 has non-uniformities that are within a prescribed range, the drive voltage for causing a prescribed current is within the prescribed range for both the main light-emitting element 11 and the compact light-emitting element 12.

In addition, as shown in FIG. 10, if the film condition of the light-emitting layer 23 has non-uniformities that are within a prescribed range, the current for obtaining a prescribed light-emission luminance is within the prescribed range for both the main light-emitting element 11 and the compact light-emitting element 12.

Referring to FIGS. 9 and 10, when the film condition of the light-emitting layer 23 has non-uniformities that are within a prescribed range, in other words, the film condition of the light-emitting layer 23 has small non-uniformities, the current-voltage characteristics have small variations, the luminous efficiency is high, and the light-emission luminance also has small variations.

Referring to FIG. 11, when the film condition of the light-emitting layer 23 has non-uniformities that are out of the prescribed range, the drive voltage for causing a prescribed current is out of the prescribed range for both the main light-emitting element 11 and the compact light-emitting element 12. In other words, the drive voltage for causing a prescribed current has larger variations for both the main light-emitting element 11 and the compact light-emitting element 12 than when the film condition of the light-emitting layer 23 has non-uniformities that are within the prescribed range.

In addition, as shown in FIG. 12, when the film condition of the light-emitting layer 23 has non-uniformities that are out of the prescribed range, the current for obtaining a prescribed light-emission luminance is out of the prescribed range for both the main light-emitting element 11 and the compact light-emitting element 12. In other words, the current for obtaining a prescribed light-emission luminance has larger variations for both the main light-emitting element 11 and the compact light-emitting element 12 than when the film condition of the light-emitting layer 23 has non-uniformities that are within the prescribed range.

Referring to FIGS. 11 and 12, when the film condition of the light-emitting layer 23 has non-uniformities that are out of the prescribed range rather than within the prescribed range, in other words, when the film condition of the light-emitting layer 23 has large non-uniformities, current does not flow uniformly in the light-emitting layer 23, which reduces the luminous efficiency of the light-emitting layer 23.

For instance, when the film condition of the light-emitting layer 23 in the main light-emitting element 11 and the compact light-emitting element 12 has large non-uniformities, the drive voltage for obtaining a prescribed light-emission luminance in the main light-emitting element 11 and the compact light-emitting element 12 has large variations. That reduces the luminous efficiency of the main light-emitting element 11 and the compact light-emitting element 12.

However, in the main light-emitting element 11, even if the film condition of the light-emitting layer 23 has variations, the current-voltage characteristics and the light emission luminance-current characteristics are averaged out in the main light-emitting element 11, and it is impossible to sense the variations of the film condition of the light-emitting layer 23.

Accordingly, the plurality of light-emitting elements in the display device 1 in accordance with the present embodiment includes: at least one main light-emitting element 11; and at least one set of compact light-emitting elements 13 including a plurality of compact light-emitting elements 12 that are smaller than the at least one main light-emitting element 11, both the at least one main light-emitting element 11 and the at least one set of compact light-emitting elements 13 including the light-emitting layer 23 of the quantum dots 23a. This particular structure enables sensing non-uniformities in the film condition of the light-emitting layer 23 that are unsensible to the main light-emitting element 11, for each of the plurality of compact light-emitting elements 12 by the one set of compact light-emitting elements 13 including the plurality of compact light-emitting elements 12 that are smaller than the main light-emitting element 11.

For instance, if in the compact light-emitting element 12, the light-emitting layer 23 has too large a thickness, the plurality of quantum dots have too large density, or the interface between the light-emitting layer 23 and the electron transport layer has too many gap non-uniformities, the electrical resistance increases, and therefore the drive voltage for causing a prescribed current also increases.

In addition, for example, if in the compact light-emitting element 12, the light-emitting layer 23 has too small a thickness, the plurality of quantum dots have too small a density, or the interface between the light-emitting layer 23 and the electron transport layer has too few gap non-uniformities, the electrical resistance decreases, and therefore the drive voltage for causing a prescribed current also decreases.

Accordingly, for example, if the drive voltage for each of the plurality of compact light-emitting elements 12 in the one set of compact light-emitting elements 13 has variations that are out of a prescribed range, it is possible to sense non-uniformities in the film condition of the light-emitting layer 23 in the one set of compact light-emitting elements 13 as being out of the prescribed range. Then, it is also possible to estimate (in other words, sense) that the light-emitting layer 23 in the main light-emitting element 11 made of the same material and patterned in the same step as the light-emitting layer 23 in the one set of compact light-emitting elements 13 has film condition non-uniformities that are out of the prescribed range. For instance, as shown in FIG. 1, the provision of the one set of compact light-emitting elements 13 in the display device 1 enables checking the display device 1 for each product and sensing the presence/absence of a defective product of the light-emitting layer 23.

Then, when the film condition of the light-emitting layer 23 is sensed as having non-uniformities that are out of the prescribed range (when the one set of compact light-emitting elements has current-voltage characteristics that are in excess of a prescribed threshold), the display device 1 during the manufacturing process needs only to be excluded from the manufacturing line as a defective product in the inspection step in the manufacturing process of the display device 1. Hence, the film condition of the light-emitting layer 23 in the display device 1 during the manufacturing process can be inspected for non-uniformities by only monitoring the current-voltage characteristics of the one set of compact light-emitting elements 13, without having to provide, for example, a bulky and cumbersome inspection instrument for monitoring the light-emission luminance of the main light-emitting element 11 in the display device 1 that is being manufactured.

Alternatively, for example, when the film condition of the light-emitting layer 23 has non-uniformities that are sensed as being out of the prescribed range, the drive voltage supplied to the main light-emitting elements 11 needs only to be corrected after the manufacture of the display device 1 is completed. In other words, the luminous efficiency of each of the plurality of main light-emitting elements 11 in the display device 1 is estimated to have decreased, the prescribed luminance can be achieved by increasing the drive voltage for the main light-emitting elements 11 on the basis of a predetermined calculation formula (detailed later) and a table without having to monitor the light-emission luminance of the main light-emitting elements 11.

In addition, the drive voltage supplied to the main light-emitting elements 11 may be corrected when the non-uniformities in the film condition of the light-emitting layer 23 have changed over time due to the use of the completely manufactured display device 1. Hence, the degradation of display quality due to changes over time during the use of the display device 1 can be corrected, which restrains degradation over an extended period of time and thus maintains high display quality.

When the division count grows and the compact light-emitting elements 12 are decreased in size, the one set of compact light-emitting elements 13 is capable of sensing non-uniformities of increasingly small length and capable of sensing non-uniformities in the film condition of the light-emitting layer 23 with high precision.

Figure 13:
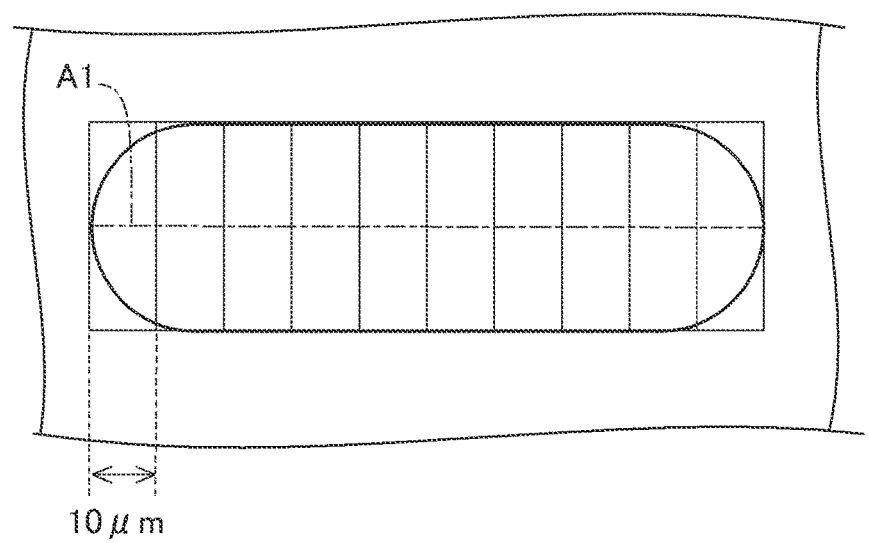
FIG. 13 is a schematic diagram of a plane of a light-emitting element prepared in an experiment in accordance with the embodiment.
Figure 14:
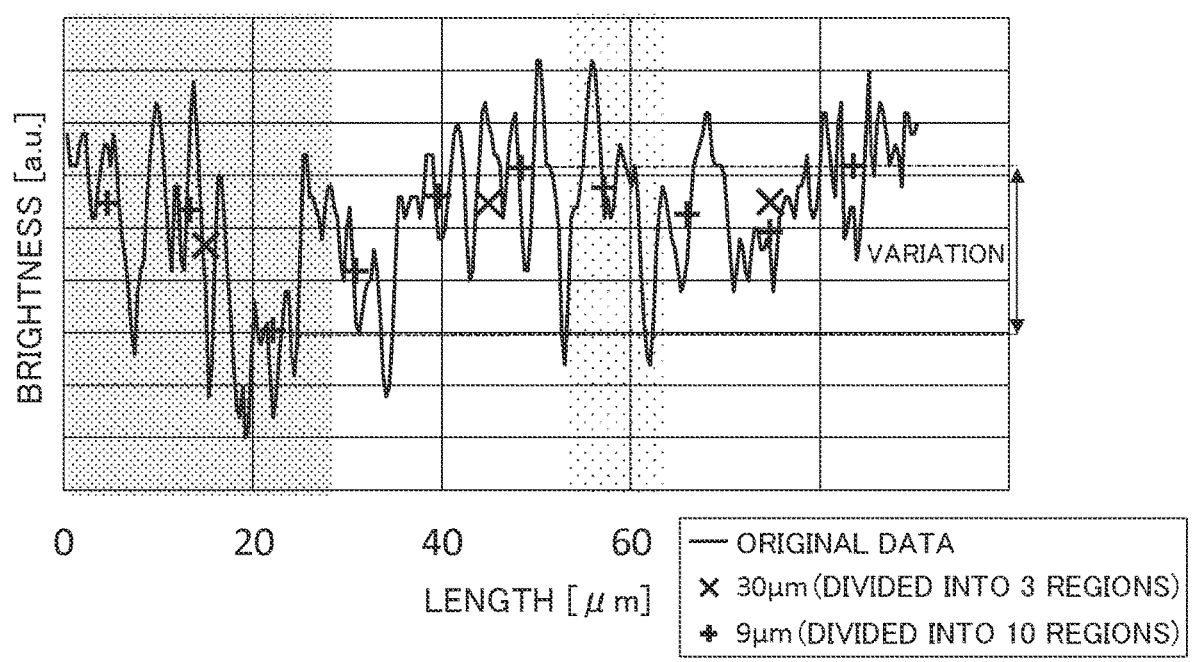
FIG. 14 is a graphical representation of the brightness condition of the light-emitting element shown in FIG. 13.
Figure 15:
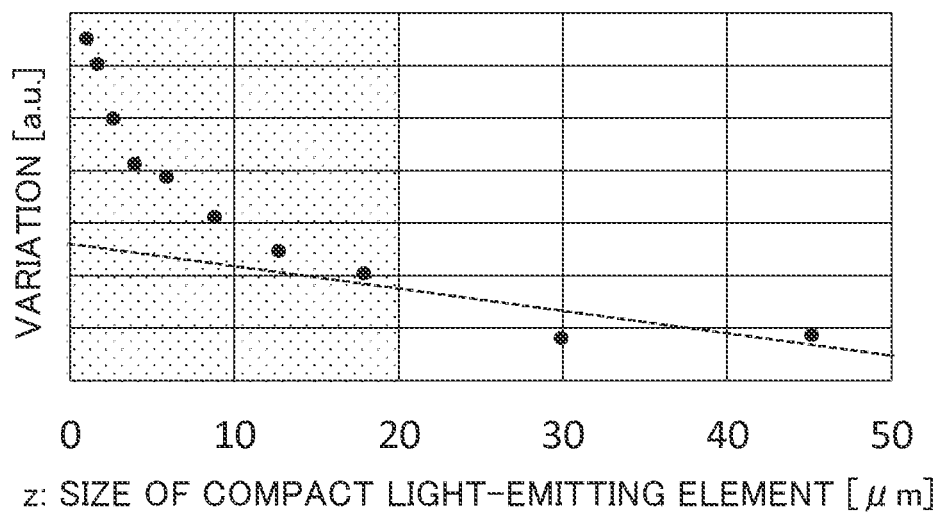
FIG. 15 is a graphical representation of changes of variations to a prescribed length "z."

Next, a description is given of results of an experiment related to the relationship between the non-uniformities in the film condition of the light-emitting layer 23 and the size of the compact light-emitting elements 12 with reference to FIGS. 13 to 15. In the experiment, light-emitting elements were prepared, and brightness along the longer side of the prepared light-emitting elements was acquired as data.

FIG. 13 is a schematic diagram of a plane of a light-emitting element prepared in an experiment in accordance with the embodiment. In the light-emitting elements in accordance with the experiment, the light-emitting layer was patterned by applying a quantum dot-dispersed octane solvent on a layer containing TFB [poly[(9,9-dioctylfluorenyl-2,7-diyl)-co-(4,4'-(N-(4-sec-butylphenyl)diphenylamine)]]. Red light-emitting quantum dots were used in which the light-emitting layer had a core-shell structure in which the core contained CdSe and the shell contained ZnS.

FIG. 13 indicates a longer side of the light-emitting element by dash-dot line A1 and shows rectangles with 10-μm pitches along dash-dot line A1 indicating the longer side. In the example shown in FIG. 13, the light-emitting element was divided into 10 regions by rectangles. An observation of the brightness of the fabricated light-emitting element in a plan view under a microscope revealed that some of the regions of the light-emitting element each surrounded by rectangles had a relatively consistent light-emission luminance thereacross, and others included bright portions and dark portions in terms of light-emission luminance, which is presumed to result from non-uniformities in the film condition of the light-emitting layer.

These non-uniformities in the film condition of the light-emitting layer are presumably determined, for example, by the wettability of the underlayer to which the quantum dot-dispersed solvent was applied and/or by the viscosity of the quantum dot-dispersed solvent. In the example shown in FIGS. 13, the light-emitting element was divided into 10 regions by rectangles with 10-μm pitches. It would be understood that this small-pitch division of the light-emitting element enabled high-definition sensing of non-uniformities in the in-plane light-emission luminance of the light-emitting element, in other words, non-uniformities in the film condition, by the rectangles. In other words, it is understood that non-uniformities in the film condition in the one set of compact light-emitting elements 13 was able to be sensed with high definition by dividing the one set of compact light-emitting elements 13 into the plurality of compact light-emitting elements 12 with small pitches.

FIG. 14 is a graphical representation of the brightness condition of the light-emitting element shown in FIG. 13. The original data for FIG. 14 was acquired, along dash-dot line A1 that was a longer side shown in FIG. 13, the brightness of an image in a plan view under a microscope (gray levels of 0 to 255 obtained by conversion to gray levels) in the light-emitting elements fabricated in this experiment. The original data was then divided into an integer number of sets of data and averaged over each prescribed length "z" that was assumed to be equal to the size of the compact light-emitting element (the length of a portion of dash-dot line A1 that was a longer side of the light-emitting element). Variations of this average value (here, maximum value–minimum value) were examined by changing z.

The symbol "+" shown in FIG. 14 indicates that the data represented variations of each of the approximately 10 sets of data into which the original data (e.g., the longer side of the light-emitting element) was divided with 9 μm pitches. The symbol "X" shown in FIG. 14 indicates that the data represented variations of each of the approximately 3 sets of data into which the original data (e.g., the longer side of the light-emitting element) was divide with 30 μm pitches. FIG. 15 is a graphical representation of changes of variations to the prescribed length "z."

FIG. 15 shows that the variations were larger when the size of the compact light-emitting element, represented by z, was smaller and in particular that changes in the variations abruptly increased when z was approximately 20 μm or shorter. This is presumably because the length scale of the non-uniformities in the film condition of the light-emitting layer was substantially 20 μm, and therefore, when z was smaller than this size, non-uniformities in the film condition of the light-emitting layer were able to be sensed. This could not be expected before the measurement. That the variations increased beyond expectations when z was approximately 20 μm or shorter had not been known until the non-uniformities in the film condition of the light-emitting layer were measured. In other words, we came to know that the variations of film characteristics (e.g., current-voltage characteristics) due to non-uniformities in the film condition of the light-emitting layer could be remarkably precisely and efficiently sensed beyond expectations when the length of the shorter side of the compact light-emitting element was reduced to 20 µm or shorter. In contrast, the size where the compact light-emitting element could be manufactured is approximately 1 µm.

From this, the length of the shorter side of the compact light-emitting element is preferably from 1 µm to 20 µm both inclusive. It is understood from this that non-uniformities in the film condition of the light-emitting layer in the light-emitting element can be precisely sensed in a range where the compact light-emitting element can be manufactured. Furthermore, the length of the shorter side of the compact light-emitting element is more preferably from 1 µm to 15 µm both inclusive, even more preferably from 1 µm to 10 µm both inclusive, and even more preferably from 1 µm to 5 µm both inclusive.

Figure 16:
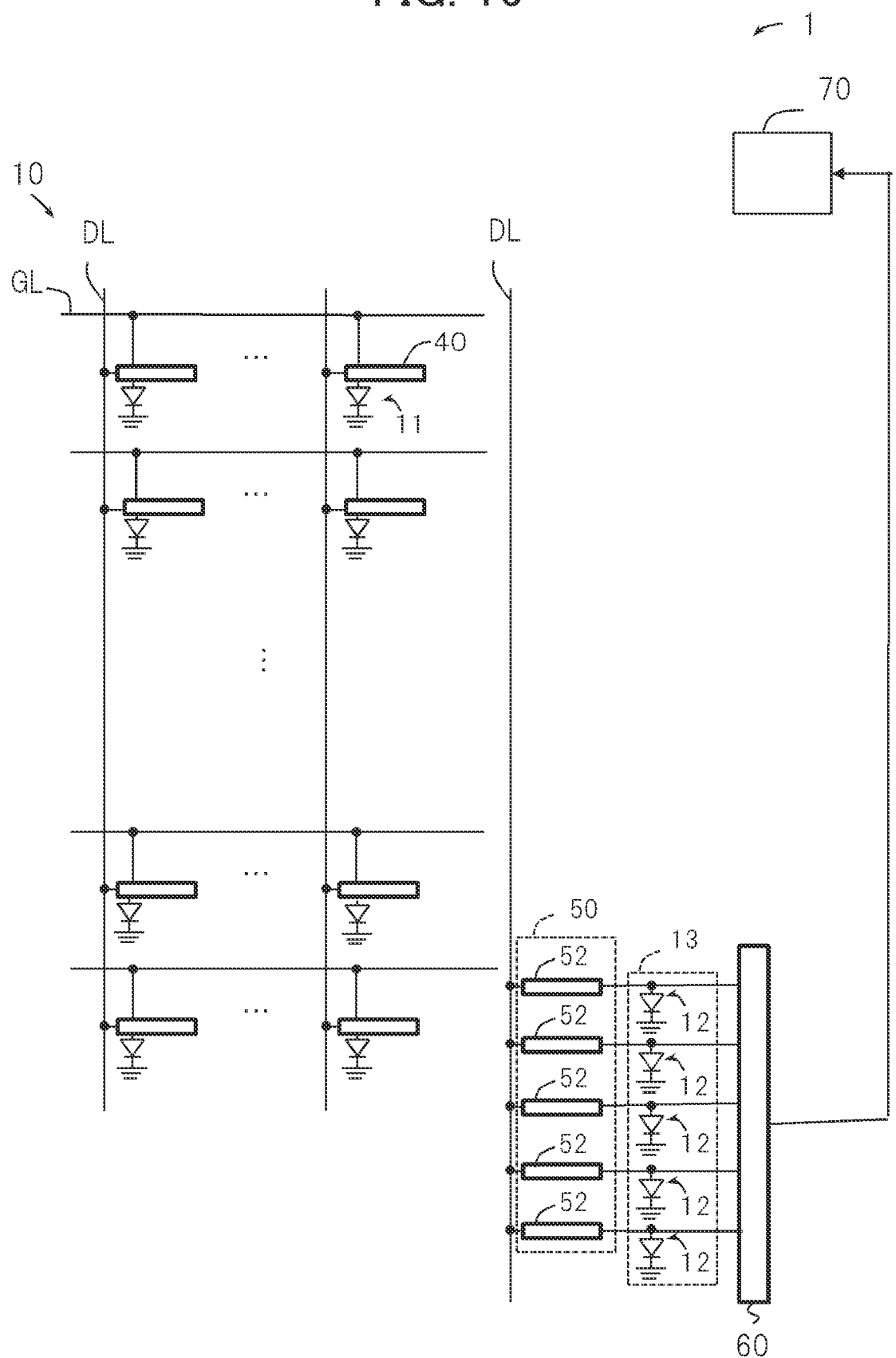
FIG. 16 is a diagram representing a configuration of respective pixel circuits for the one set of compact light-emitting elements and the main light-emitting element in the display device in accordance with the embodiment.

FIG. 16 is a diagram representing a configuration of respective pixel circuits for the one set of compact light-emitting elements 13 and the main light-emitting elements 11 in the display device 1 in accordance with the embodiment. Referring to FIG. 16, the display device 1 includes: at least one set of first pixel circuits 50 that are pixel circuits for controlling the driving of the at least one set of compact light-emitting elements 13; a plurality of second pixel circuits 40 that are pixel circuits for controlling the driving of the plurality of main light-emitting elements 11; an A/D (analog to digital) converter (voltage acquisition unit) 60; and a power supply control unit 70. The display device 1 further includes a plurality of data signal lines DL and a plurality of scan signal lines GL.

The plurality of data signal lines DL are fed with a data signal corresponding to a gray level from a data driver (not shown). The plurality of scan signal lines GL are fed with a scan signal for selecting any of the plurality of scan signal lines GL from a gate driver (not shown). The plurality of data signal lines DL and the plurality of scan signal lines GL are disposed so as to cross each other in the display area 10.

The main light-emitting elements 11 and the second pixel circuits 40 are disposed corresponding to the intersections of the plurality of data signal lines DL and the plurality of scan signal lines GL. The second pixel circuits 40 are connected respectively to the data signal lines DL and the scan signal lines GL. The main light-emitting elements 11 are connected to the second pixel circuits 40.

The at least one set of first pixel circuits 50 are provided in the same number as and corresponding to the at least one set of compact light-emitting elements 13. In the present embodiment, for example, because the number of the at least one set of compact light-emitting elements 13 is one, the number of the at least one set of first pixel circuits 50 is also one.

The one set of first pixel circuits 50 includes the plurality of thin film transistors Tr11 (FIG. 18) electrically connected to the first electrodes 27 respectively of the plurality of compact light-emitting elements 12 in the at least one set of compact light-emitting elements 13. The one set of first pixel circuits 50 includes a plurality of first pixel circuits 52. The plurality of first pixel circuits 52 are provided in the same number as and corresponding to the plurality of compact light-emitting elements 12. In the present embodiment, for example, the one set of first pixel circuits 50 includes five first pixel circuits 52. Note that the number of the one set of first pixel circuits 50 is not limited to five.

The first pixel circuits 52 controls the driving of the compact light-emitting elements 12. The plurality of first pixel circuits 52 are connected to the data signal lines DL. The compact light-emitting elements 12 are connected to the first pixel circuits 52.

The A/D converter 60 is connected to the plurality of first pixel circuits 52 and the plurality of compact light-emitting elements 12. The A/D converter 60 acquires an analog drive voltage for each of the plurality of compact light-emitting elements 12 and converts the acquired analog drive voltage to a digital signal. This enables digital processing of the voltage information for the compact light-emitting elements 12, thereby enabling high-precision defective-product screening and light-emission-luminance correction.

The power supply control unit 70 is connected to the A/D converter 60. The power supply control unit 70 controls the current supplied to the first electrodes 21 or the second electrodes 25 of the plurality of main light-emitting elements 11 in accordance with the drive voltage for each of the plurality of compact light-emitting elements 12 acquired by the A/D converter 60. For instance, the power supply control unit 70 corrects a value that is in accordance with the gray scale of the data signal outputted from the source driver in accordance with the drive voltage for each of the plurality of compact light-emitting elements 12. The power supply control unit 70 hence controls the current supplied to the plurality of main light-emitting elements 11 in accordance with the non-uniformities in the film condition of the plurality of compact light-emitting elements 12.

Note that when the current for the main light-emitting elements 11 is not corrected in accordance with the drive voltage for each of the plurality of compact light-emitting elements 12, the display device 1 may include no power supply control unit 70.

Figure 17:
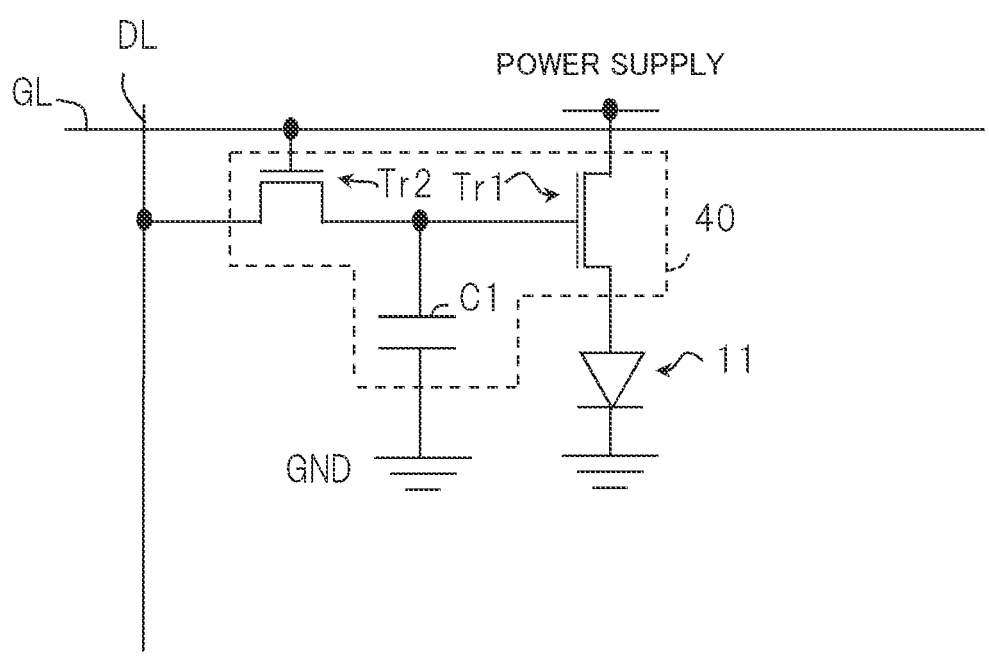
FIG. 17 is a diagram representing an exemplary circuit configuration of a second pixel circuit in accordance with the embodiment.

FIG. 17 is a diagram representing an exemplary circuit configuration of the second pixel circuit 40 in accordance with the embodiment. Referring to FIG. 17, each second pixel circuit 40 includes, for example, the thin film transistor Tr1, a thin film transistor Tr2, and a capacitor C1. The thin film transistor Tr1 is a drive transistor for driving the main light-emitting elements 11. The thin film transistor Tr1 has the source electrode thereof connected to a power supply line to which a first level (e.g., HIGH level) voltage is applied, the gate electrode thereof connected to the drain electrode of the thin film transistor Tr2 and to one of the terminals of the capacitor C1, and the drain electrode thereof connected to the anode electrode (e.g., first electrode 21) of the main light-emitting elements 11. The thin film transistor Tr2 is a selection transistor for selecting the main light-emitting element 11 to be caused to emit light in accordance with the scan signal supplied from the scan signal line GL. The thin film transistor Tr2 has the source electrode thereof connected to the data signal line DL, the gate electrode thereof connected to the scan signal line GL, and the drain electrode thereof connected to the gate electrode of the thin film transistor Tr1 and to one of the terminals of the capacitors C1.

In the main light-emitting element 11, the cathode electrode (e.g., second electrode 25) opposite the anode electrode connected to the thin film transistor Tr1 and the other terminal opposite one of the terminals of the capacitor C1 are respectively connected to power supply lines to which a second level (e.g., LOW level) voltage is applied for grounding.

In response to a scan signal being supplied to the thin film transistor Tr2 from the scan signal line GL, the thin film transistor Tr2 is turned on, thereby supplying the data signal from the data signal line DL to the thin film transistor Tr1 via the thin film transistor Tr2. This electric current flow in the main light-emitting element 11 in accordance with the data signal causes the main light-emitting element 11 to emit light.

Note that the circuit configuration and circuit operation of the second pixel circuit 40 described with reference to FIG. 17 is a mere example and not necessarily limited to this description.

Figure 18:
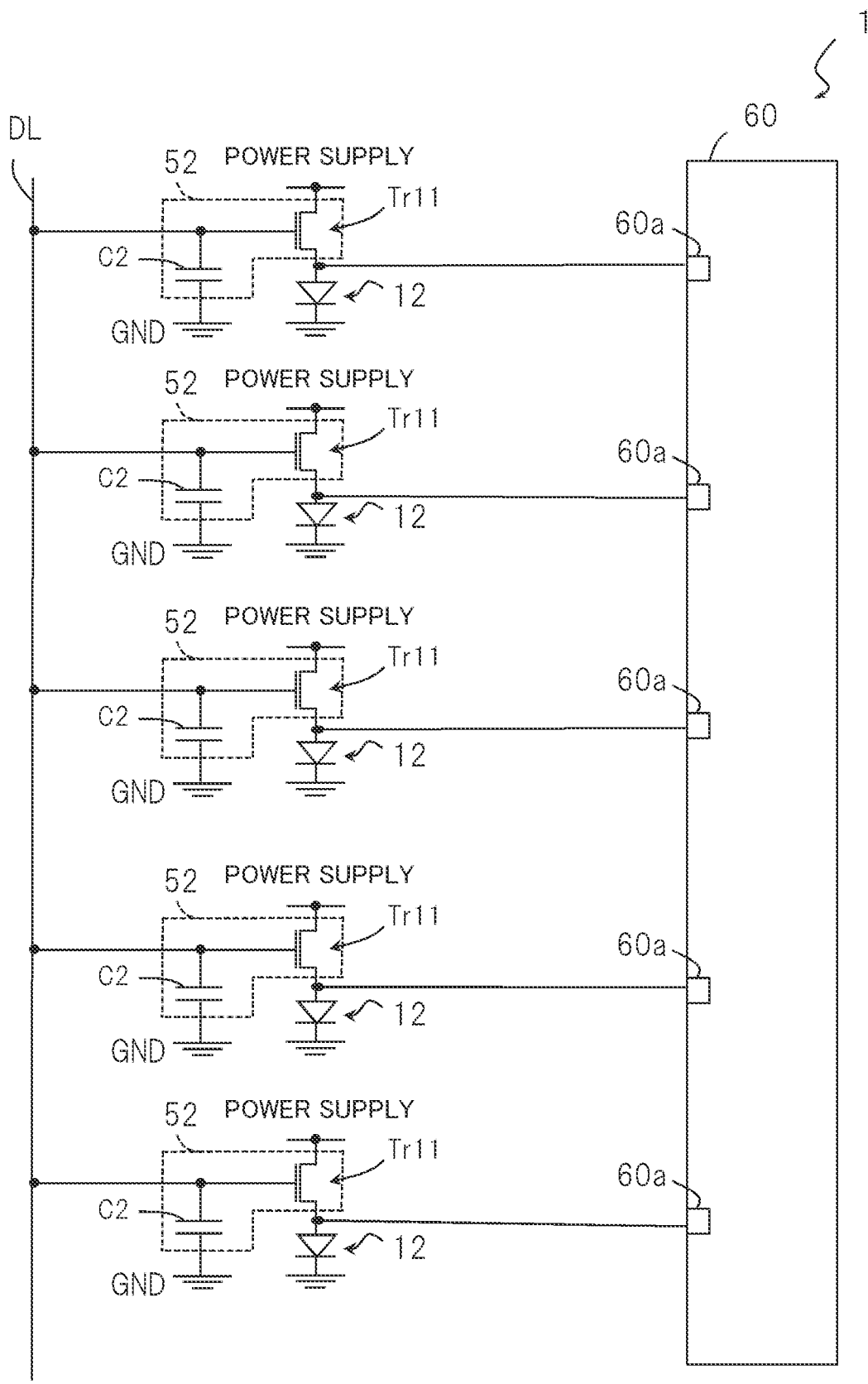
FIG. 18 is a diagram representing an exemplary circuit configuration of a plurality of first pixel circuits in one set of first pixel circuits in accordance with the embodiment.

FIG. 18 is a diagram representing an exemplary circuit configuration of the plurality of first pixel circuits 52 in the one set of first pixel circuits 50 in accordance with the embodiment. Each of the plurality of first pixel circuits 52 includes, for example, the thin film transistor Tr11 and a capacitor C2. The thin film transistor Tr11 is a drive transistor for driving the compact light-emitting element 12. The thin film transistor Tr11 has the source electrode thereof connected to a power supply line to which the first level (e.g., HIGH level) voltage is applied, the gate electrode thereof connected to the data signal line DL and to one of the terminals of the capacitor C1, and the drain electrode thereof connected to the anode electrode (e.g., first electrode 27) of the compact light-emitting element 12.

In the compact light-emitting element 12, the cathode electrode (e.g., second electrode 25) opposite the anode electrode connected to the thin film transistor Tr11 and the other terminal opposite one of the terminals of the capacitor C2 are respectively connected to the power supply lines to which the second level (e.g., LOW level) voltage is applied for grounding.

A data signal is fed from the data signal line DL to the thin film transistor Tr11. This electric current flow in the main light-emitting element 11 in accordance with the data signal causes the compact light-emitting element 12 to emit light.

Note that the plurality of compact light-emitting elements 12 do not need to be individually selected, and therefore the plurality of first pixel circuits 52 do not need to be connected to the scan signal lines GL. Note that the plurality of first pixel circuits 52 may have the same circuit configuration (in other words, the circuit configuration including the thin film transistors Tr2 connected to the scan signal lines GL) as the second pixel circuits 40.

The A/D converter 60 has a plurality of input terminals 60a respectively connected between the anode electrodes of the plurality of compact light-emitting elements 12 and the drain electrodes of the thin film transistors Tr11. Then, the analog drive voltages applied respectively to the compact light-emitting elements 12 are inputted respectively to the plurality of input terminals 60a, so that the A/D converter 60 converts the analog drive voltages inputted respectively to the plurality of input terminals 60a to digital signals and outputs the digital signals to, for example, the power supply control unit 70 (see FIG. 16).

Note that the circuit configuration and circuit operation of the first pixel circuit 52 described with reference to FIG. 18 is a mere example and not necessarily limited to this description.

Figure 19:
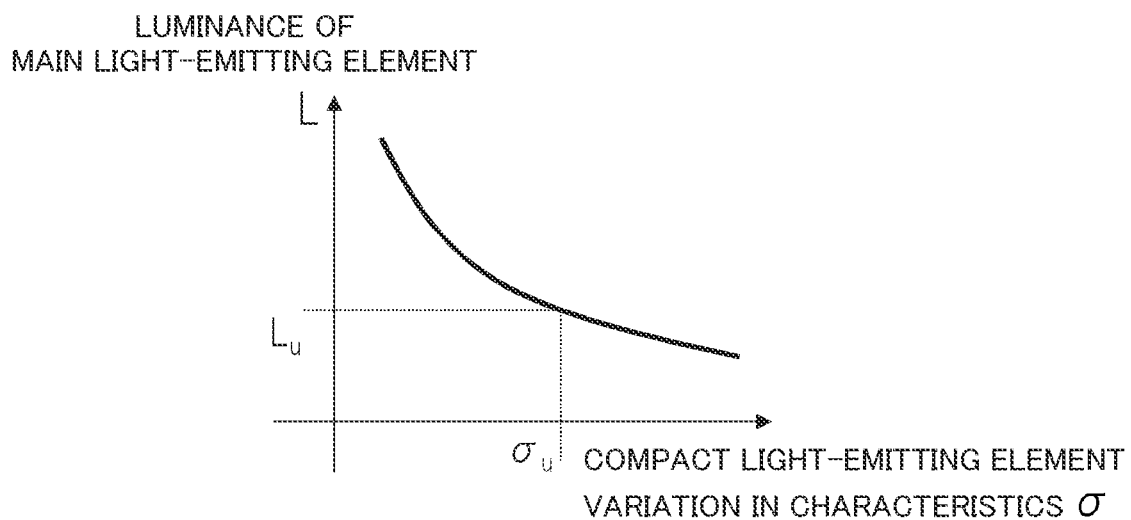
FIG. 19 is a graphical representation of a method by which a power supply control unit corrects a data signal in the display device in accordance with the embodiment.

FIG. 19 is a graphical representation of a method by which the power supply control unit 70 (see FIG. 16) corrects a data signal in the display device 1 in accordance with the embodiment. A description is given of an exemplary method of the power supply control unit 70 acquiring a digital signal from the A/D converter 60 and correcting a data signal to be supplied to the main light-emitting elements 11. The power supply control unit 70 corrects the current density for the main light-emitting elements 11 on the basis of the digital signal fed from the A/D converter 60 as detailed below.

For instance, many measurements are made in advance on the main light-emitting elements 11 and the one set of compact light-emitting elements 13 (the number of the compact light-emitting elements 12 per set is assumed to be m), to examine beforehand the luminance and current characteristics correlation between the characteristics variations of the one set of compact light-emitting elements 13 and the main light-emitting elements 11. Here, the characteristics variation $\sigma$ of the one set of compact light-emitting elements 13 is defined as the standard deviation of the voltage value Vi for the compact light-emitting elements 12 ($i$) when a prescribed current density $J=J_0$ flows in the one to m compact light-emitting elements 12 ($\sigma=1/(m-1) \Sigma i$ (Vi−Vave) 2), where Vave=1/m $\Sigma$iVi is an average value of each Vi. Note that this is not the only possibility and that the characteristics variation $\sigma$ of the one set of compact light-emitting elements 13 may be defined as the difference between the maximum value and the minimum value, that is, $\sigma$=max [Vi]−min [Vi]. Alternatively, the characteristics variation $\sigma$ of the one set of compact light-emitting elements 13 may be defined as the number of Vi's that are larger (or smaller) than a prescribed threshold value VC.

A relationship between $\sigma$ and the luminance L of the main light-emitting element 11 when a prescribed current density $J=J_0$ flows (relationship shown in the graph in FIG. 19) is determined beforehand. The luminous efficiency of the main light-emitting element 11 decreases, and luminance also decreases, with an increase in the variation $\sigma$. This relationship is stored as a table.

For the measurement of the compact light-emitting element 12 when the display device 1 is used, the variation $\sigma$u is measured when J (the current density in each compact light-emitting element 12)=$J_0$. An element luminance Lu when $J=J_0$ is determined by relating this result to the table. When the desirable luminance is Ld, the main light-emitting element 11 needs only be driven by current density J=Ld/Lu*$J_0$.

FIG. 20 is a diagram representing an exemplary circuit configuration of the plurality of first pixel circuits 52 in the one set of first pixel circuits 50 in accordance with Variation Example 1 of the embodiment. FIG. 21 is a diagram representing an exemplary circuit configuration of the plurality of first pixel circuits 52 in the one set of first pixel circuits 50 in accordance with Variation Example 2 of the embodiment.

The number of the input terminals 60a of the A/D converter 60 (in other words, the number of channels) is often, for example, two, four, or eight. Accordingly, both the number of the compact light-emitting elements 12 in the one set of compact light-emitting elements 13 and the number of the first pixel circuits 50 in the one set of first pixel circuits 50 may be either two as shown in FIG. 20 or four as shown in FIG. 21. Hence, the A/D converter 60 can be a general-purpose A/D converter.

Figure 22:
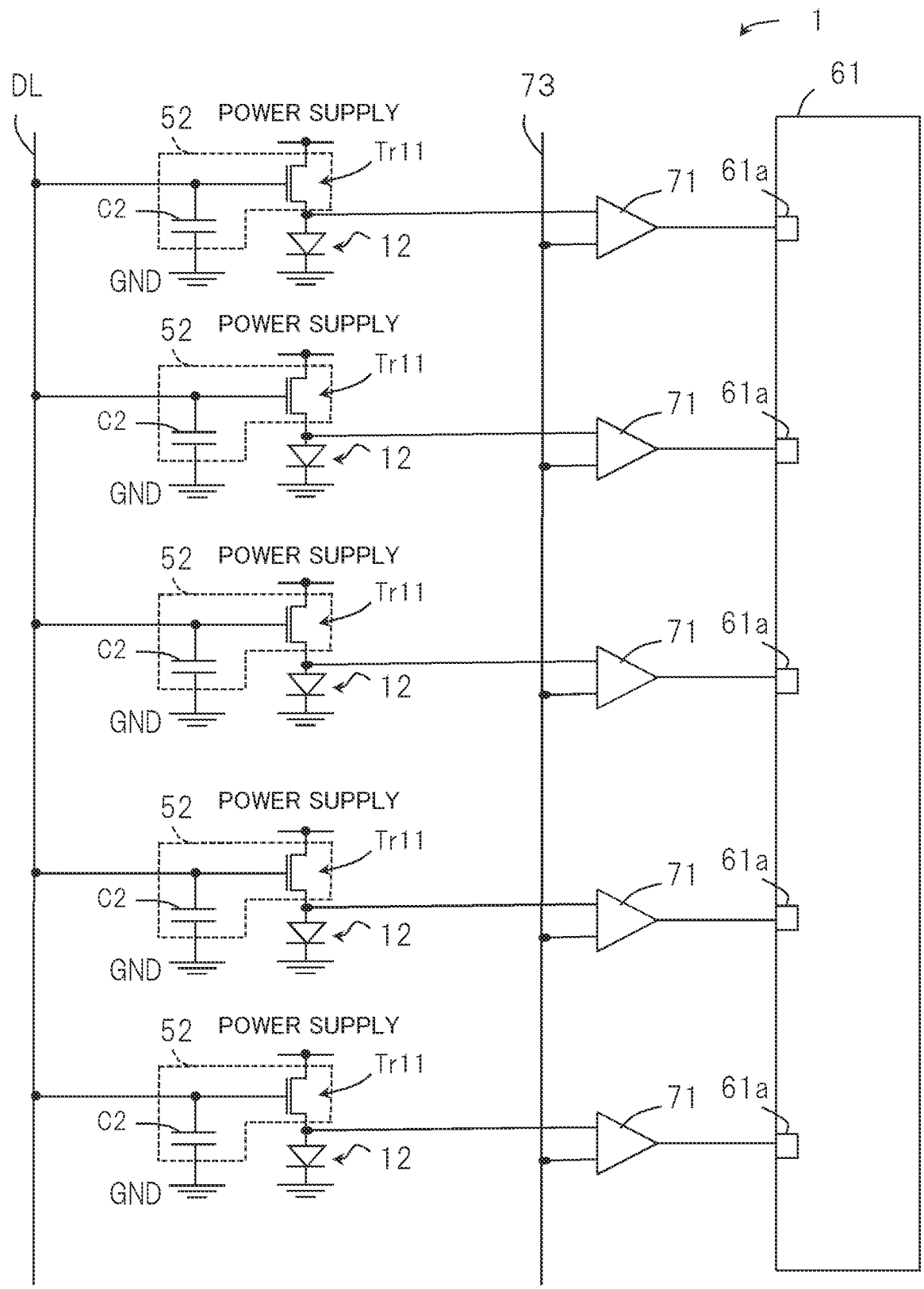
FIG. 22 is a diagram representing an exemplary circuit configuration of the display device in accordance with Variation Example 3 of the embodiment.

FIG. 22 is a diagram representing an exemplary circuit configuration of the display device 1 in accordance with Variation Example 3 of the embodiment. Referring to FIG. 22, the display device 1 may include a reference voltage line 73, a plurality of comparators (voltage acquisition units) 71, and a counter circuit (voltage acquisition unit) 61 in place of the A/D converter 60. The A/D converter 60 can be hence omitted to simplify the circuit and the computation of the output thereof.

In the display device 1 shown in FIG. 22, the plurality of comparators 71 are provided in the same number as and corresponding to the plurality of compact light-emitting elements 12. Each of the plurality of comparators 71 has a first input terminal thereof connected between the anode electrode of the compact light-emitting element 12 and the drain electrode of the thin film transistor Tr11, a second input terminal thereof connected to the reference voltage line 73, and an output terminal thereof connected to an input terminal 61a of the counter circuit 61.

Figure 23:
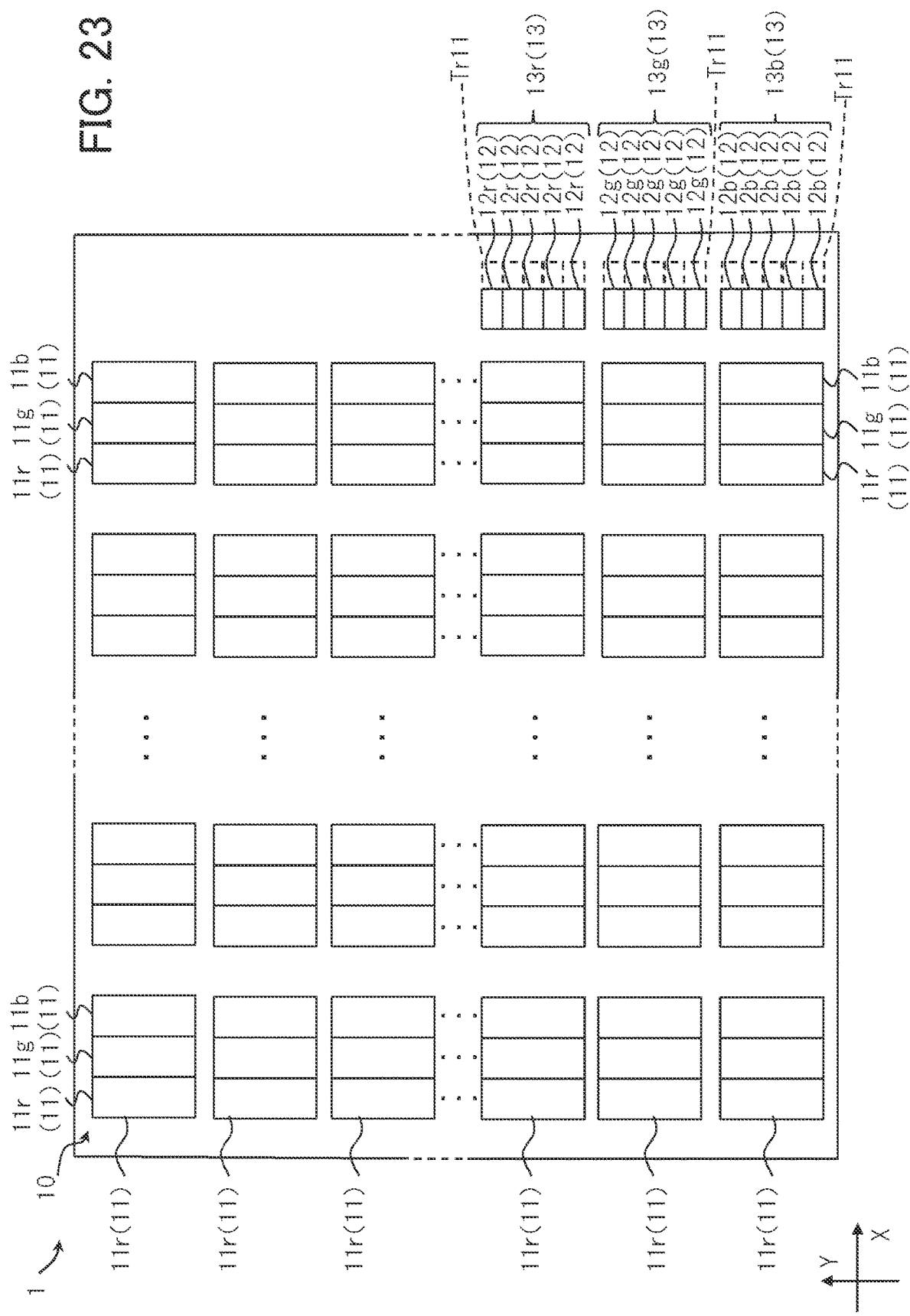
FIG. 23 is a schematic plan view of a structure of the display device in accordance with Variation Example 4 of the embodiment.

FIG. 23 is a schematic plan view of a structure of the display device 1 in accordance with Variation Example 4 of the embodiment. The display device 1 may include, as the plurality of main light-emitting elements 11, not only the plurality of main light-emitting elements 11r that emit red light but also a plurality of main light-emitting elements 11g that emit green light (light of a second color) that has a shorter peak wavelength than red light and a plurality of main light-emitting elements 11b that emit blue light (light of a third color) that has a shorter peak wavelength than red light and green light. The display device 1 may further include a plurality of sets of compact light-emitting elements 13 as the at least one set of compact light-emitting elements 13.

The example in FIG. 23 shows an example where the display device 1 includes one set of compact light-emitting elements 13 for each color of light emitted by the main light-emitting elements 11r, 11g, 11b as the plurality of sets of compact light-emitting elements 13. For instance, the display device 1 includes, as the at least one set of compact light-emitting elements 13, one set of green-light-emitting, compact light-emitting elements 13g and one set of blue-light-emitting, compact light-emitting elements 13b as well as the one set of red-light-emitting, compact light-emitting elements 13r. This configuration enables sensing variations for the individual groups of quantum dots of different materials, thereby enabling higher-precision defective-product screening and light-emission-luminance correction.

For instance, the one set of compact light-emitting elements 13g emits light of the same color as the plurality of main light-emitting elements 11g. The light-emitting layer 23 in the one set of compact light-emitting elements 13g and the light-emitting layer 23 in the plurality of main light-emitting elements 11g are made of the same material and provided in the same step. A plurality of quantum dots 23a contained in the light-emitting layer 23 included in the plurality of main light-emitting elements 11g and a plurality of quantum dots 23 a contained in the light-emitting layer 23 included in the one set of compact light-emitting elements 13g contain the same type of material. The one set of compact light-emitting elements 13g includes a plurality of compact light-emitting elements 12g (e.g., five compact light-emitting elements 12g). By making, of the same material and in the same step, for example, the light-emitting layer 23 included in the plurality of main light-emitting elements 11g and the light-emitting layer 23 included in the one set of compact light-emitting elements 13g in this manner, the levels of emission non-uniformities of each layer can be made identical to some extent in the main light-emitting elements 11 and the one set of compact light-emitting elements 13, which enables high-precision defective-product screening and light-emission-luminance correction.

For instance, the one set of compact light-emitting elements 13b emits light of the same color as the plurality of main light-emitting elements 11b. The light-emitting layer 23 included in the one set of compact light-emitting elements 13b and the light-emitting layer 23 included in the plurality of main light-emitting elements 11b are made of the same material and provided in the same step. The plurality of quantum dots 23 contained in the light-emitting layer 23 included in the plurality of main light-emitting elements 11b and the plurality of quantum dots 23 contained in the light-emitting layer 23 included in the one set of compact light-emitting elements 13b contain the same type of material. The one set of compact light-emitting elements 13b includes the plurality of compact light-emitting elements 12b (e.g., five compact light-emitting elements 12b). By making, of the same material and in the same step, for example, the light-emitting layer 23 included in the plurality of main light-emitting elements 11b and the light-emitting layer 23 included in the one set of compact light-emitting elements 13b in this manner, the levels of emission non-uniformities of each layer can be made identical to some extent in the main light-emitting elements 11b and the one set of compact light-emitting elements 13b, which enables high-precision defective-product screening and light-emission-luminance correction.

Note that the display device 1 does not necessarily include the plurality of sets of compact light-emitting elements 13 for each color of light emitted by the main light-emitting elements 11r, 11g, 11b as the at least one set of compact light-emitting elements 13 and may include one set of compact light-emitting elements 13 only for a specific color of emitted light. For instance, the display device 1 may include one set of compact light-emitting elements 13b that emits blue light out of red light, green light, and blue light. Quantum dots tend to have a low luminous efficiency for blue light out of red light, green light, and blue light. Therefore, the display device 1, owing to the inclusion of the one set of compact light-emitting elements 13b that emits blue light, is capable of sensing non-uniformities in the film condition of the light-emitting layer 23 that emits blue light for which the light-emitting layer 23 has difficulty in achieving both non-uniformities in the film condition and luminous efficiency. Therefore, even when the display device 1 includes the one set of compact light-emitting elements 13 only for a specific color of emitted light, the display device 1 can effectively enables defective-product screening and light-emission-luminance correction.

Figure 24:
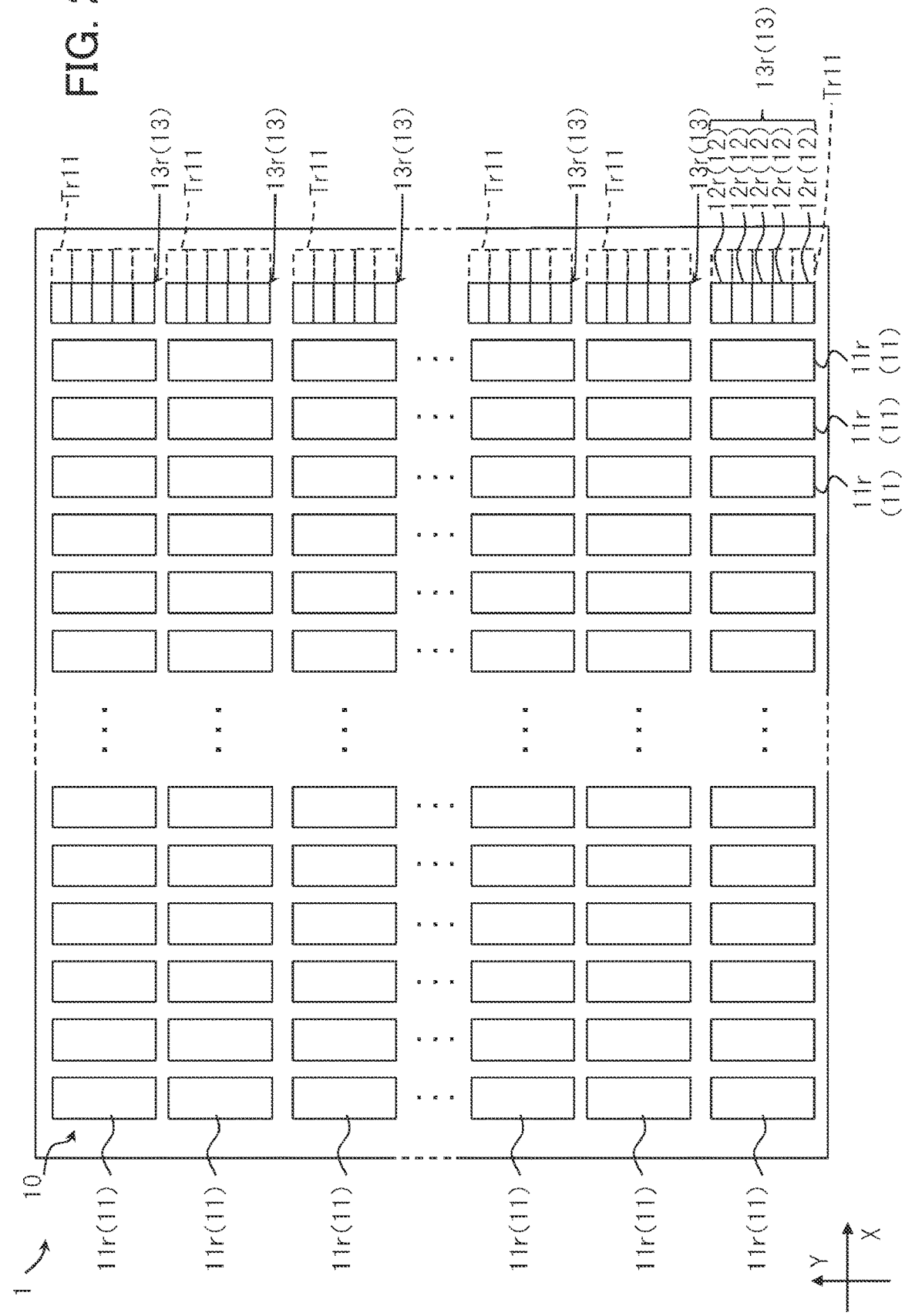
FIG. 24 is a schematic plan view of a structure of the display device in accordance with Variation Example 5 of the embodiment.
Figure 25:
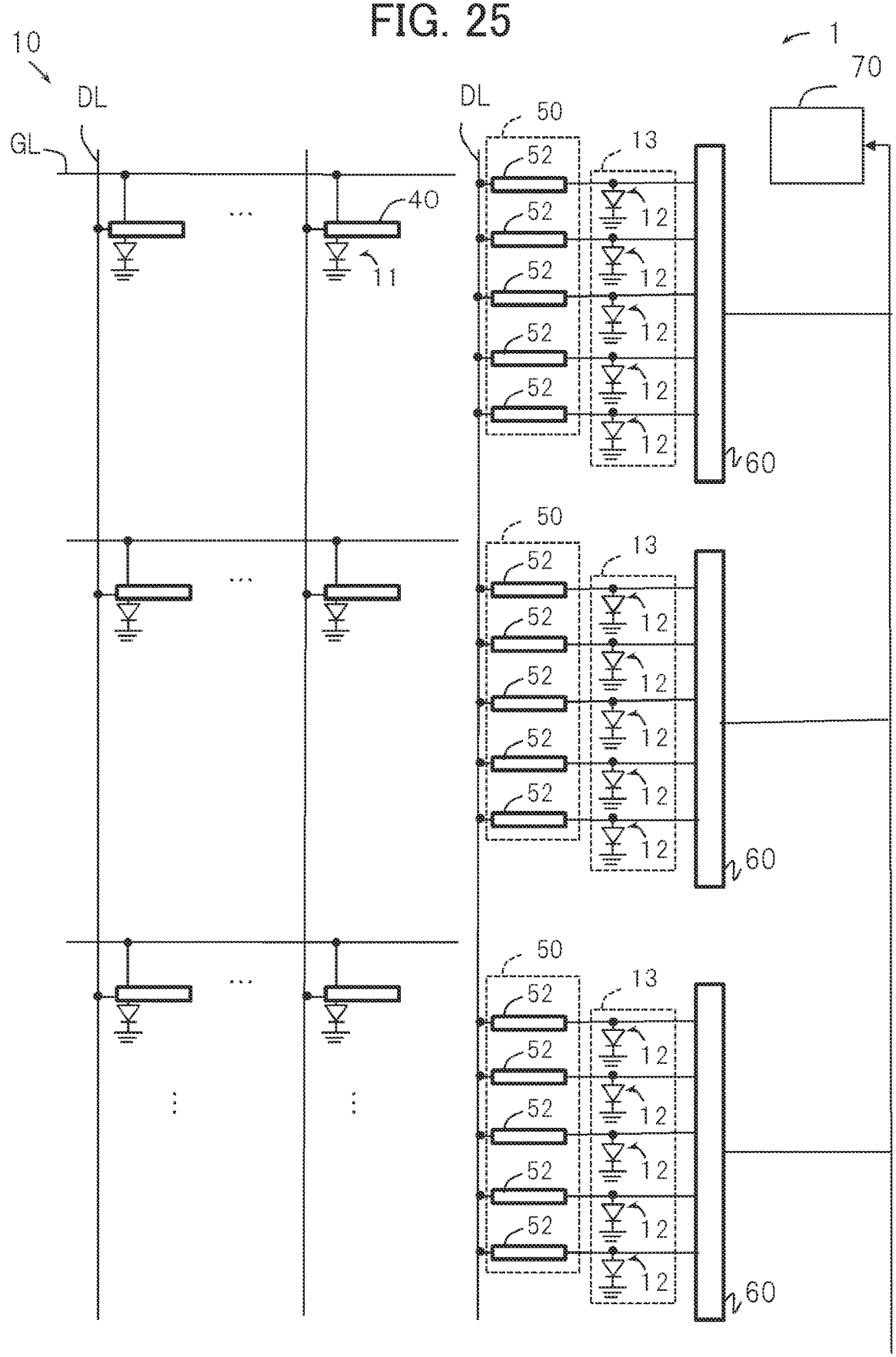
FIG. 25 is a diagram representing a circuit configuration of the display device in accordance with Variation Example 5 of the embodiment.

FIG. 24 is a schematic plan view of a structure of the display device 1 in accordance with Variation Example 5 of the embodiment. The display device 1 shown in FIG. 24 has a structure that includes, in addition to the display device 1 shown in FIG. 1, the at least one set of compact light-emitting elements 13r for each row with respect to the plurality of main light-emitting elements 11r provided next to each other in the XY-directions (row and column directions). FIG. 25 is a diagram representing a circuit configuration of the display device 1 in accordance with Variation Example 5 of the embodiment. Referring to FIG. 25, the display device 1 includes, for each row, the A/D converter 60 connected respectively to the one set of compact light-emitting elements 13r.

The display device 1 shown in FIGS. 24 and 25 includes as many sets of compact light-emitting elements 13r as the rows. This particular structure enables sensing non-uniformities in the film condition of the light-emitting layer 23 for each row. The display device 1 can hence capable of sensing even when non-uniformities in the film condition vary in further detail between rows in the same device.

Then, when the number of rows where non-uniformities in the film condition of the light-emitting layer 23 are out of a prescribed range (the current-voltage characteristics of the one set of compact light-emitting elements 13r are beyond a prescribed threshold) is greater than or equal to a specified value, the display device 1 during manufacture needs only to be removed from the manufacturing line as a defective product in an inspection step in the manufacture of the display device 1. Hence, non-uniformities in the film condition of the light-emitting layer 23 can be inspected for each row by simply monitoring the current-voltage characteristics of the one set of compact light-emitting elements 13r in each row, without having to provide, for example, a large-scale inspection instrument for monitoring the light-emission luminance of the main light-emitting elements 11r in the display device 1 during manufacture.

Meanwhile, when, for example, non-uniformities that are out of a prescribed range are detected in the film condition of the light-emitting layer 23, the drive voltage supplied to the main light-emitting elements 11r needs only to be corrected for each row where the non-uniformities are out of the prescribed range after the display device 1 is completely manufactured. In other words, because the luminous efficiency of each of the plurality of main light-emitting elements 11r in the display device 1 has presumably decreased, the prescribed light-emission luminance can be obtained by increasing the drive voltage for the main light-emitting elements 11r for each row on the basis of a calculation formula (detailed later) and a table that are predetermined in further detail, without having to monitor the light-emission luminance of the main light-emitting elements 11r.

In addition, the drive voltage supplied to the main light-emitting elements 11r may be corrected when the non-uniformities in the film condition of the light-emitting layer 23 have changed over time due to the use of the completely manufactured display device 1. Hence, the degradation of the display quality of the plurality of main light-emitting elements 11r due to changes over time during the use of the display device 1 can also be corrected in further detail, in other words, for each row. Consequently, differences in the light-emission luminance of the main light-emitting elements 11r between rows that are due to differences in degradation of non-uniformities in the film condition of the light-emitting layer 23 for each row can be restrained over an extended period of time. The display quality of the display device 1 can be hence maintained at a high level.

Note that the main light-emitting elements 11 and the one set of compact light-emitting elements 13 do not necessarily emit red light and may emit light of any color other than red, such as green, blue, or white, also in the display device 1 in accordance with this Variation Example 5.

Figure 26:
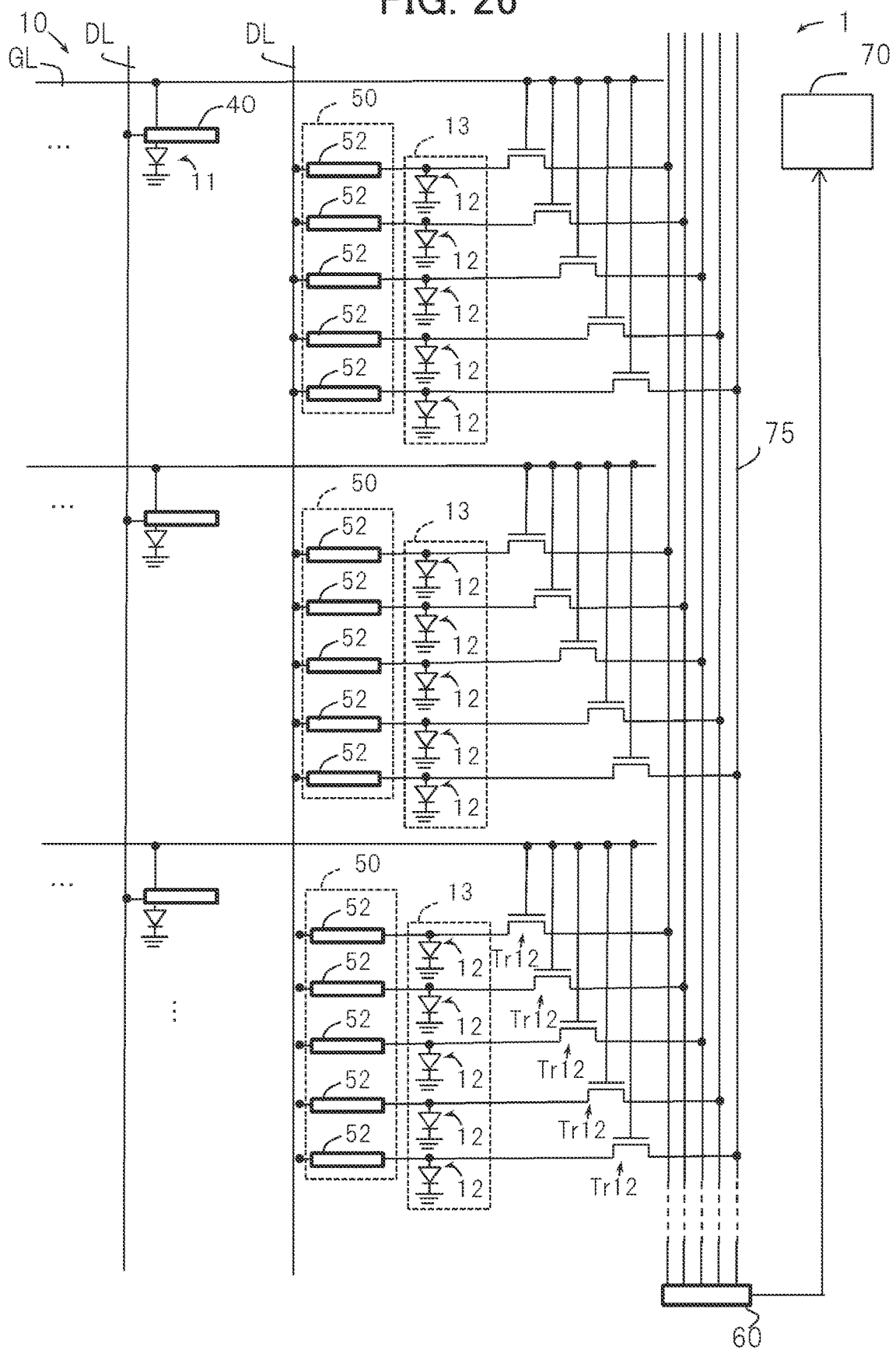
FIG. 26 is a diagram representing a circuit configuration of the display device in accordance with Variation Example 6 of the embodiment.

FIG. 26 is a diagram representing a circuit configuration of the display device 1 in accordance with Variation Example 6 of the embodiment. Referring to FIG. 26, the display device 1 shown in FIG. 24 may include a circuit configuration shown in FIG. 26.

Referring to FIG. 26, the display device 1 does not necessarily include the A/D converter for each row, but may include: as many thin film transistors Tr12 as the compact light-emitting elements 12 included in the one set of compact light-emitting elements 13; a plurality of output lines 75; and one A/D converter 60.

Each thin film transistor Tr12 has the gate electrode thereof connected to the scan signal line GL, the source electrode thereof connected to a first pixel circuit and the anode electrode of the compact light-emitting element 12, and the drain electrode connected to the output line 75. Then, the plurality of output lines 75 are connected respectively to the A/D converter 60.

In this configuration, the thin film transistor Tr12 is turned on by a scan signal from the scan signal line GL, and an analog drive voltage for the compact light-emitting element 12 is inputted to the A/D converter 60 via the output line 75 through the thin film transistor Tr12 that is turned on. Then, the A/D converter 60 converts the inputted analog drive voltage to a digital signal and outputs to the power supply control unit 70. Hence, the configuration of the A/D converter 60 can be reduced, which simplifies the circuit configuration.

Figure 27:
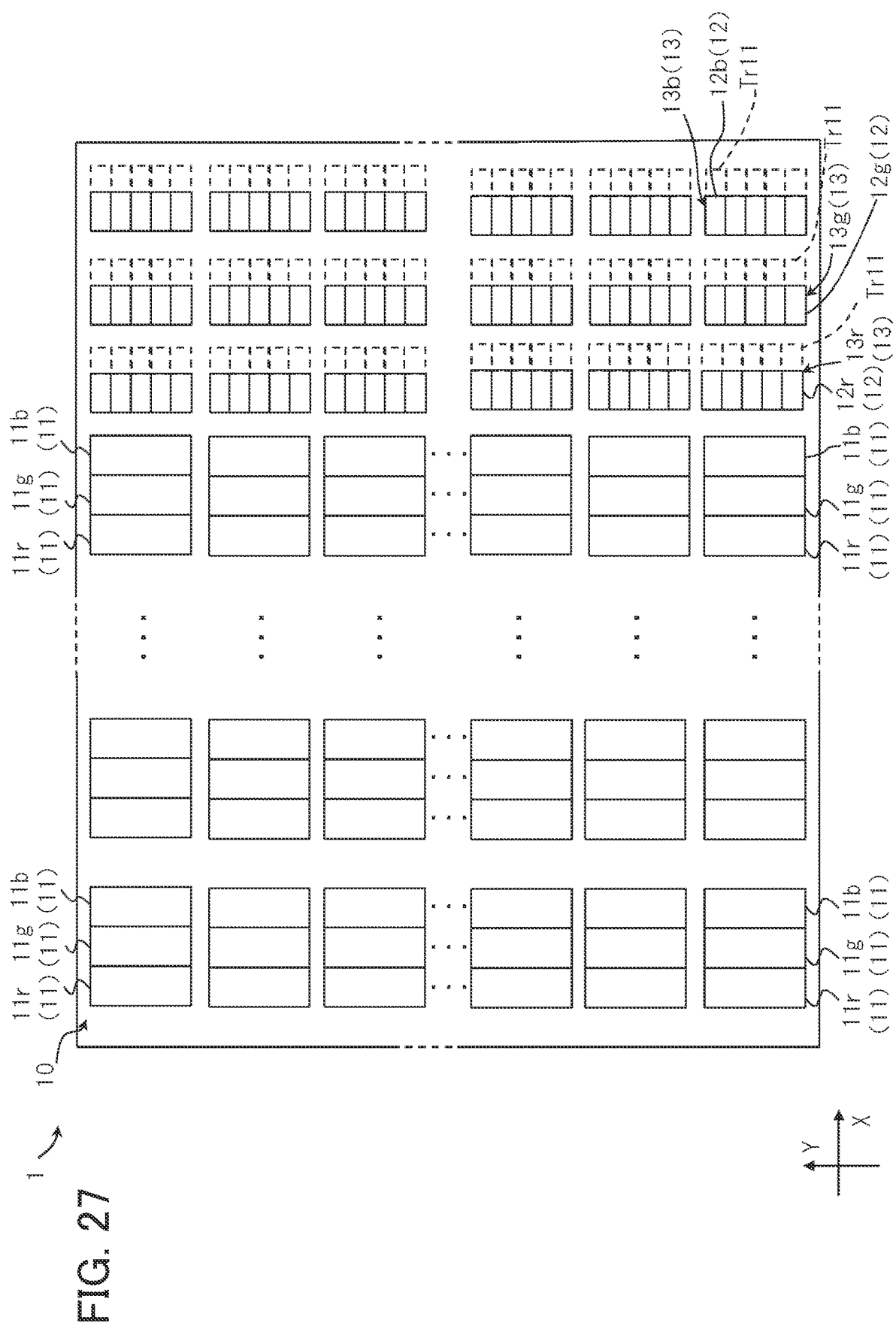
FIG. 27 is a schematic plan view of a structure of the display device in accordance with Variation Example 7 of the embodiment.

FIG. 27 is a schematic plan view of a structure of the display device 1 in accordance with Variation Example 7 of the embodiment. The display device 1 may have the structure shown in FIG. 27. The display device 1 shown in FIG. 27 has a structure that includes, in addition to the display device 1 in accordance with Variation Example 4 shown in FIG. 23, the plurality of sets of compact light-emitting elements 13 for each color of emitted light in each row. Referring to FIG. 27, the display device 1 includes, as the at least one set of compact light-emitting elements 13, one set of red-light-emitting, compact light-emitting elements 13r, one set of green-light-emitting, compact light-emitting elements 13g, and one set of blue-light-emitting, compact light-emitting elements 13b in each row.

This configuration enables sensing, in each row, non-uniformities in the film condition that differ for each color in further detail. In addition, inspect precision can be further improved in screening defective products from non-defective products during the manufacture of the display device 1, which enables more precise removal of defective products. In addition, since the drive voltages for the respective main light-emitting elements 11r, 11g, 11b can be corrected for each row and for each color after the display device 1 is completely manufactured, the prescribed light-emission luminance of the respective main light-emitting elements 11r, 11g, 11b can be obtained by correcting the drive voltage in accordance with a decrease in the light-emission luminances of the respective main light-emitting elements 11r, 11g, 11b in further detail. Furthermore, since correction can be made in further detail in accordance with changes over time in non-uniformities in the film condition for each main light-emitting element 11r, 11g, 11b in each row in the completely manufactured display device 1, the display quality can be maintained at a higher level over an extended period of time.

Note that the display device 1 does not necessarily include the one set of compact light-emitting elements 13r, the one set of compact light-emitting elements 13g, and the one set of compact light-emitting elements 13b for each row and may include one set of compact light-emitting elements 13 for a specific color of emitted light for each row or a plurality of sets of compact light-emitting elements 13 for each row. For instance, the display device 1 may have a structure that includes, for each row, the one set of compact light-emitting elements 13b that emits blue light for which quantum dots have a low luminous efficiency out of red light, green light, and blue light and that does not include the one set of compact light-emitting elements 13r and the one set of compact light-emitting elements 13g. This particular structure enables sensing, for each row, non-uniformities in the film condition of the light-emitting layer 23 that emits blue light for which the light-emitting layer 23 has difficulty in achieving both non-uniformities in the film condition and luminous efficiency.

Figure 28:
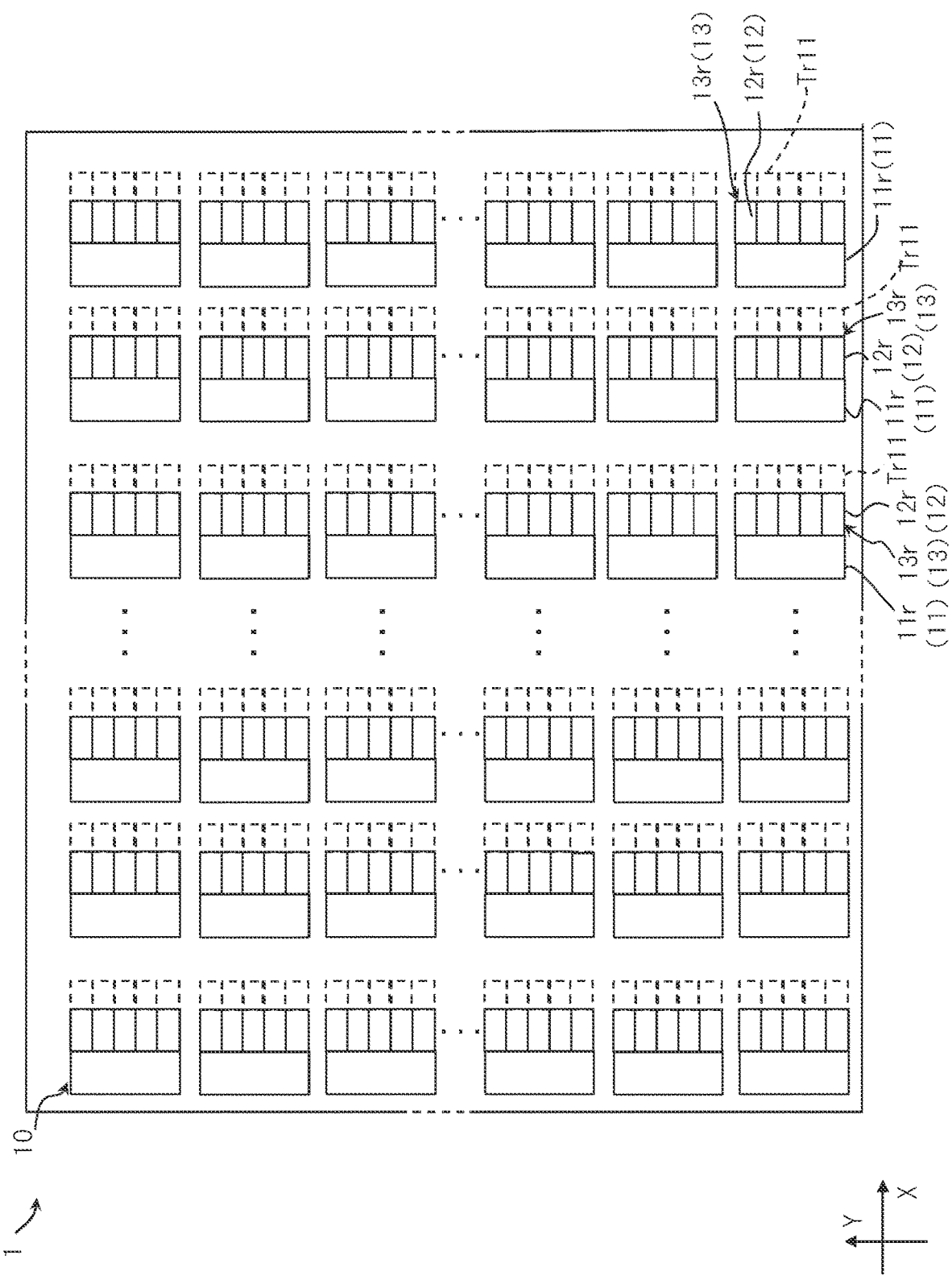
FIG. 28 is a schematic plan view of a structure of the display device in accordance with Variation Example 8 of the embodiment.

FIG. 28 is a schematic plan view of a structure of the display device 1 in accordance with Variation Example 8 of the embodiment. The display device 1 may have the structure shown in FIG. 28. The display device 1 shown in FIG. 28 has a structure that includes, in addition to the display device 1 shown in FIG. 1, the one set of compact light-emitting elements 13r for each of the plurality of main light-emitting elements 11r.

Figure 29:
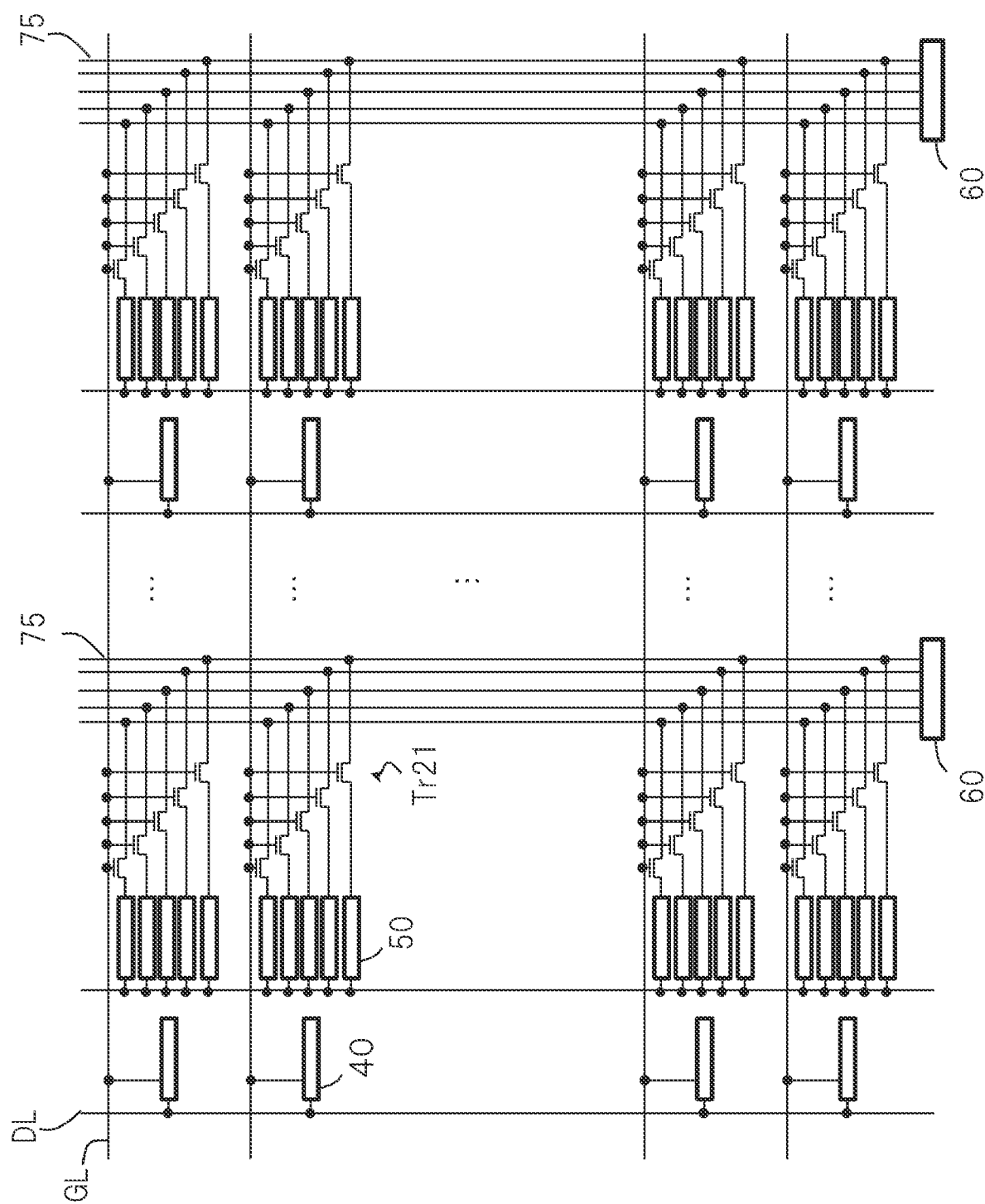
FIG. 29 is a diagram representing a circuit configuration of the display device in accordance with Variation Example 8 of the embodiment.

FIG. 29 is a diagram representing a circuit configuration of the display device 1 in accordance with Variation Example 8 of the embodiment. Referring to FIG. 29, the plurality of output line 75 and the A/D converter 60 shown in FIG. 26 may be provided for each column. In this particular structure, a digital signal from the A/D converter 60 is outputted to the power supply control unit 70 for each column.

The display device 1 shown in FIGS. 28 and 29 is capable of sensing non-uniformities in the film condition of the light-emitting layer 23 by the one set of compact light-emitting elements 13r for each of the plurality of main light-emitting elements 11r. In other words, the display device 1 enables sensing non-uniformities in the film condition that differ in the display surface of the display device 1 in further detail. That also enables more precisely inspecting the removal of defective products during the manufacture of the display device 1, thereby further improving inspection precision in screening defective products from non-defective products. In addition, since the drive voltage can be corrected for each of the plurality of main light-emitting elements 11r after the display device 1 is completely manufactured, the prescribed light-emission luminance of each of the plurality of main light-emitting elements 11r can be obtained by correcting the drive voltage in accordance with a decrease in the light-emission luminance of each of the plurality of main light-emitting elements 11r in further detail. Furthermore, since correction can be made in further detail in accordance with changes over time of each of the plurality of main light-emitting elements 11r after the display device 1 is completely manufactured, higher display quality can be maintained over an extended period of time.

Note that in the display device 1 shown in FIGS. 28 and 29, the one set of compact light-emitting elements 13r is provided in a matrix in the display area 10, and the one set of compact light-emitting elements 13r may be caused to emit light together with the main light-emitting elements 11 when an image is displayed. This configuration can render the display device 1 brighter. It should be noted however that the main light-emitting elements 11 have better luminous efficiency than the one set of compact light-emitting elements 13r that include the plurality of compact light-emitting elements 12r. Therefore, the display device 1 preferably causes the plurality of main light-emitting elements 11, out of the plurality of main light-emitting elements 11 and the compact light-emitting elements 13r, to emit light when an image is displayed.

Note that in the display device 1 in accordance with this variation Example 8, the main light-emitting elements 11 and the one set of compact light-emitting elements 13 do not necessarily emit red light and may emit light of any color other than red, such as green light, blue light, or white light.

Figure 30:
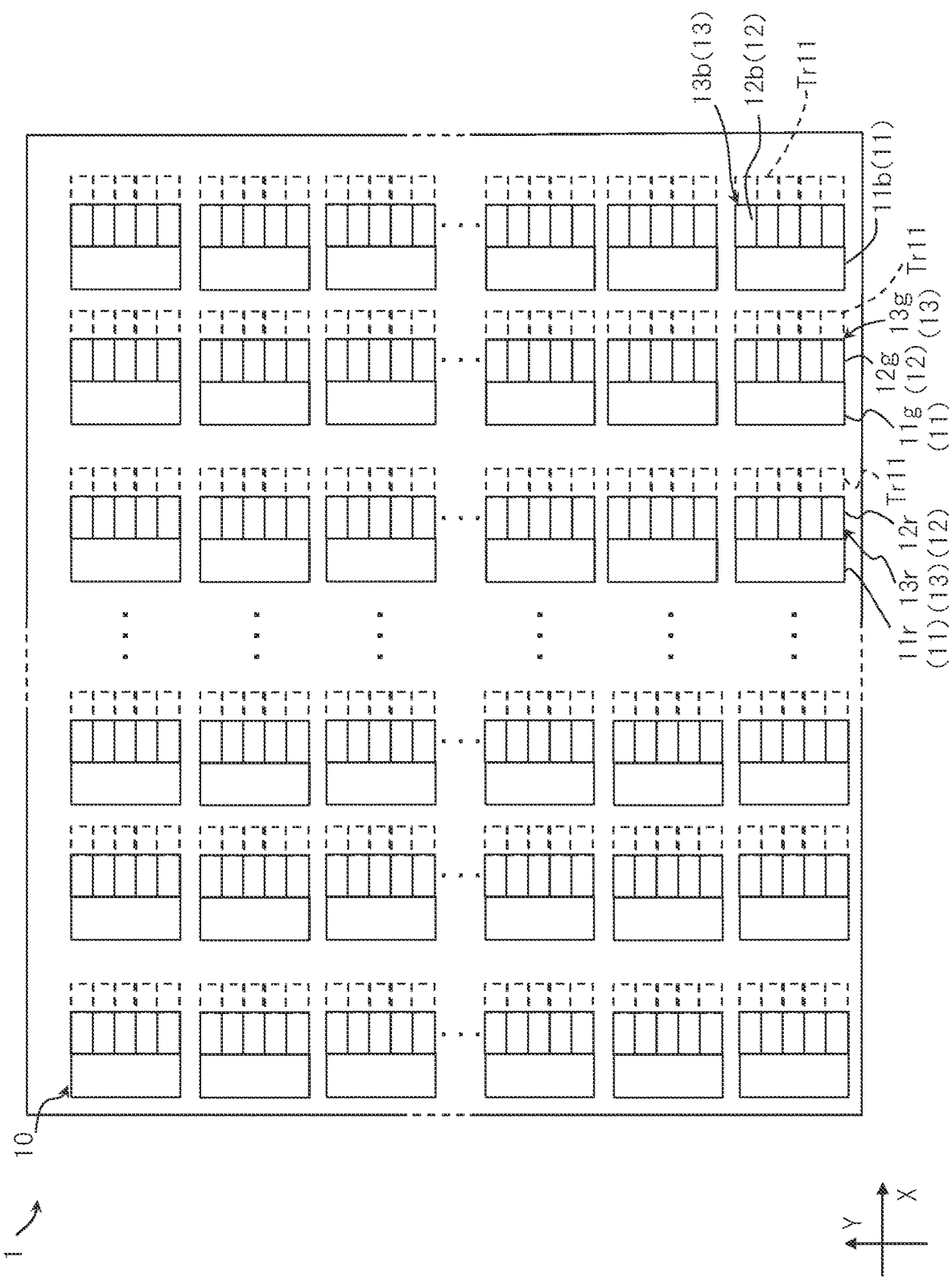
FIG. 30 is a schematic plan view of a structure of the display device in accordance with Variation Example 9 of the embodiment.

FIG. 30 is a schematic plan view of a structure of the display device 1 in accordance with Variation Example 9 of the embodiment. The display device 1 may have the structure shown in FIG. 30. The display device 1 shown in FIG. 30 includes a structure that includes, out of the display device 1 shown in FIG. 27, the at least one set of compact light-emitting elements 13 for each group of main light-emitting elements 11 that emit light of the same color. The display device 1 shown in FIG. 30 includes: one set of compact light-emitting elements 12r adjacent to the red-light-emitting, main light-emitting element 11r, the one set of compact light-emitting elements 12r emitting the same red light as the main light-emitting element 11r; one set of compact light-emitting elements 12g adjacent to the green-light-emitting, main light-emitting element 11g, the one set of compact light-emitting elements 12g emitting the same green light as the main light-emitting element 11g; and one set of compact light-emitting elements 12b adjacent to the blue-light-emitting, main light-emitting element 11b, the one set of compact light-emitting elements 12b emitting the same blue light as the main light-emitting element 11b.

This configuration enables sensing non-uniformities in the film condition that differ for each color in the display surface of the display device 1 in further detail. In addition, inspect precision can be further improved in screening defective products from non-defective products during the manufacture of the display device 1, and defective products can be more precisely removed. In addition, since the drive voltage can be corrected for each of the plurality of main light-emitting elements 11r, 11g, 11b in the display surface after the display device 1 is completely manufactured, the prescribed luminance can be obtained for each of the plurality of main light-emitting elements 11r, 11g, 11b by correcting the drive voltage in accordance with a decrease in the light-emission luminance of each of the plurality of main light-emitting elements 11r, 11g, 11b in further detail. Furthermore, since correction can be made in accordance with changes over time of each of the plurality of main light-emitting elements 11r, 11g, 11b in further detail after the display device 1 is completely manufactured, higher display quality can be maintained over an extended period of time.

Note that the display device 1 does not necessarily include the one set of compact light-emitting elements 13r, the one set of compact light-emitting elements 13g, and the one set of compact light-emitting elements 13b for each group of main light-emitting elements 11 that emit light of the same color and may include one set of compact light-emitting elements 13 for a specific color of emitted light in the main light-emitting elements 11 that emit light of the same color. For instance, the display device 1 may have a structure that includes, adjacent to the main light-emitting element 11b, the one set of compact light-emitting elements 13b that emits blue light for which quantum dots have a low luminous efficiency out of red light, green light, and blue light and that does not include the one set of compact light-emitting elements 13r and the one set of compact light-emitting elements 13g. This particular structure enables sensing, for each of the main light-emitting elements 11b, non-uniformities in the film condition of the light-emitting layer 23 that emits blue light for which the light-emitting layer 23 has difficulty in achieving both non-uniformities in the film condition and luminous efficiency.

In addition, any of the elements described in the embodiments and variation examples above may be used in a proper combination so long as the combination works out well.

Note that throughout the foregoing embodiment, the main light-emitting element has been described as having approximately the same size as the one set of compact light-emitting elements. The size is however a mere example and not essential in the drawings unless specifically mentioned otherwise. An aspect of the disclosure is not limited to this. For instance, the one set of compact light-emitting elements may be either larger than the main light-emitting element or smaller than the main light-emitting element. In addition, the size of the compact light-emitting element is not necessarily the same as the size into which the main light-emitting element is divided, in other words, the lengths of the shorter side of the main light-emitting element and the longer side of the compact light-emitting element are not necessarily related to each other, and the compact light-emitting element and the main light-emitting element may have sizes and shapes that are unrelated in any manner.

In addition, the compact light-emitting element may or may not be caused to emit light together with the main light-emitting element during operation of the product. When the compact light-emitting element is caused to emit light together with the main light-emitting element during operation of the product, the luminance of the display device per unit area can be improved. Even when the compact light-emitting element is not caused to emit light together with the main light-emitting element during operation of the product, the display device can be manufactured without paying attention to, for example, the size and color of emitted light for the compact light-emitting element, which increases the occupation ratio of the main light-emitting element. Additionally, the main light-emitting element can be uniquely and efficiently designed, which further allows for a design with higher luminous efficiency. The luminance per unit area and the luminous efficiency can be hence improved.

The invention claimed is:

1. A display device comprising:
    a plurality of light-emitting elements, each including:
        a first electrode;
        a second electrode; and
        a light-emitting layer between the first electrode and the second electrode, the plurality of light-emitting elements further including:
        at least one main light-emitting element containing quantum dots in the light-emitting layer, the at least one main light-emitting element being arranged in a display area that is an area where images are displayed; and
        at least one particular light-emitting element that includes a plurality of compact light-emitting elements, each of the plurality of compact light-emitting elements being smaller than the at least one main light-emitting element and including a light-emitting layer that emits light, each of the plurality of compact light-emitting elements being disposed in a frame area that is an area surrounding the display area, wherein
    the plurality of compact light-emitting elements is arranged along a length direction of a corresponding one of the at least one main light-emitting element.

2. The display device according to claim 1, wherein the plurality of compact light-emitting elements included in the at least one particular light-emitting element emits light of a same color.

3. The display device according to claim 1, wherein the at least one main light-emitting element and the plurality of compact light-emitting elements included in the at least one particular light-emitting element emit light of a same color.

4. The display device according to claim 1, wherein the light-emitting layers in the plurality of compact light-emitting elements are formed as a single piece in the at least one particular light-emitting element.

5. The display device according to claim 1, wherein the quantum dots contained in the light-emitting layer of the at least one main light-emitting element and quantum dots contained in the light-emitting layers of the plurality of compact light-emitting elements contain a same type of material.

6. The display device according to claim 1, wherein each of the plurality of compact light-emitting elements has a shorter side having a length of from 1 μm to 20 μm both inclusive.

7. The display device according to claim 1, wherein the at least one main light-emitting element includes a first main light-emitting element that emits light of a first color.

8. The display device according to claim 7, wherein
    the at least one main light-emitting element comprises a plurality of main light-emitting elements including the first main light-emitting element, and
    the plurality of main light-emitting elements further includes:
        a second main light-emitting element that emits light of a second color having a peak wavelength shorter than the light of the first color; and
        a third main light-emitting element that emits light of a third color having a peak wavelength shorter than the light of the second color.

9. The display device according to claim 8, wherein
    the at least one particular light-emitting element comprises a plurality of particular light-emitting elements, and
    the plurality of particular light-emitting elements is provided for each of the first main light-emitting element, the second main light-emitting element, and the third main light-emitting element.

10. The display device according to claim 1, wherein
    the at least one main light-emitting element comprises a plurality of main light-emitting elements,
    the at least one particular light-emitting element comprises a plurality of particular light-emitting elements,
    the plurality of main light-emitting elements is arranged in a first direction, and
    the plurality of particular light-emitting elements is provided for the plurality of main light-emitting elements, and is arranged in a second direction that intersects with the first direction.

11. The display device according to claim 1, wherein
    the at least one main light-emitting element comprises a plurality of main light-emitting elements,
    each of the plurality of particular light-emitting elements is provided for each of the plurality of main light-emitting elements.

12. The display device according to claim 1, wherein the at least one particular light-emitting element comprises only one particular light-emitting element.

13. The display device according to claim 1, further comprising a voltage acquisition unit that acquires a voltage between the first electrode and the second electrode for each of the plurality of compact light-emitting elements of the at least one particular light-emitting element.

14. The display device according to claim 1, further comprising:
    a power supply control unit, wherein
    the at least one main light-emitting element comprises a plurality of main light-emitting elements, and
    the power supply control unit controls an electric current supplied to either the first electrodes or the second electrodes of the plurality of main light-emitting elements in accordance with the voltage acquired by a voltage acquisition unit for each of the plurality of compact light-emitting elements.

15. The display device according to claim 1, further comprising at least one set of first pixel circuits including pixel circuits that each controls driving of one of the plurality of compact light-emitting elements,
    wherein the pixel circuits include a plurality of drive transistors electrically connected, respectively, to the first electrodes of the plurality of compact light-emitting elements included in the at least one particular light-emitting element.

16. The display device according to claim 1, further comprising:
a plurality of second pixel circuits, wherein
the at least one main light-emitting element comprises a plurality of main light-emitting elements,
the plurality of second pixel circuits are pixel circuits that control driving of the plurality of main light-emitting elements, and
the plurality of second pixel circuits includes a plurality of drive transistors electrically connected, respectively, to the first electrodes of the plurality of main light-emitting elements.

17. The display device according to claim 16, wherein an area of each of the plurality of drive transistors included in the pixel circuits and an area of each of the plurality of drive transistors included in the plurality of second pixel circuits are substantially equal.

18. The display device according to claim 1, wherein the first electrode is divided into a plurality of first electrodes in one set of compact light-emitting elements of the plurality of compact light-emitting elements.

19. The display device according to claim 1, wherein
each of the at least one main light-emitting element is electrically connected to a first transistor, and
each of the plurality of compact light-emitting elements is electrically connected to a second transistor, the second transistor being different from the first transistor.

* * * * *